(12) United States Patent
Suzuki et al.

(10) Patent No.: US 8,847,632 B2
(45) Date of Patent: Sep. 30, 2014

(54) SEMICONDUCTOR DEVICE

(71) Applicant: Renesas Electronics Corporation, Kanagawa (JP)

(72) Inventors: Shigeyuki Suzuki, Kanagawa (JP); Masato Suzuki, Kanagawa (JP)

(73) Assignee: Renesas Electronics Corporation, Kanagawa Kawasaki-Shi (JP)

( * ) Notice: Subject to any disclaimer, the term of this patent is extended or adjusted under 35 U.S.C. 154(b) by 8 days.

(21) Appl. No.: 13/722,306

(22) Filed: Dec. 20, 2012

(65) Prior Publication Data

US 2013/0241620 A1 Sep. 19, 2013

(30) Foreign Application Priority Data

Mar. 14, 2012 (JP) ................................. 2012-056959

(51) Int. Cl.
*H03K 3/00* (2006.01)
*H03K 19/0185* (2006.01)
*H03K 5/01* (2006.01)

(52) U.S. Cl.
CPC .......... *H03K 5/01* (2013.01); *H03K 19/018528* (2013.01)
USPC ........... 327/108; 327/170; 327/379; 327/389; 326/30

(58) Field of Classification Search
USPC ........................................................ 327/108
See application file for complete search history.

(56) References Cited

U.S. PATENT DOCUMENTS

| 7,348,794 | B2 | 3/2008 | Tanaka | |
|---|---|---|---|---|
| 7,659,747 | B2* | 2/2010 | Shiraishi et al. | 326/83 |
| 7,795,931 | B2 | 9/2010 | Kobayashi | |
| 7,994,825 | B2* | 8/2011 | Ushio et al. | 326/115 |
| 8,253,445 | B2 | 8/2012 | Kanda | |
| 2008/0024178 | A1* | 1/2008 | Kim et al. | 327/108 |
| 2011/0163791 | A1 | 7/2011 | Kanda | |

FOREIGN PATENT DOCUMENTS

| JP | 2007-060072 A | 3/2007 |
|---|---|---|
| JP | 2009-171562 A | 7/2009 |
| JP | 2010-283453 A | 12/2010 |
| JP | 2011-071798 A | 4/2011 |
| JP | 2011-142382 A | 7/2011 |

* cited by examiner

*Primary Examiner* — Lincoln Donovan
*Assistant Examiner* — Patrick Chen
(74) *Attorney, Agent, or Firm* — McDermott Will & Emery LLP

(57) ABSTRACT

Provided is a semiconductor device with an output circuit in which a variation of a common voltage is suppressed in an idling mode and in a normal mode. The output circuit provided in the semiconductor device includes a first termination resistor and a second termination resistor and a drive circuit which flows current through the termination resistors. The output circuit is configured so as to be able to adjust the value of current which flows through the first termination resistor and the second termination resistor or the value of resistance of the first termination resistor and the second termination resistor.

9 Claims, 30 Drawing Sheets

FIG. 5

| IDLE | SEL2~4 | INP1 | INN1 | INP2~4 | INN2~4 | REMARKS |
|---|---|---|---|---|---|---|
| 0 | 0 | /INP | /INN | /INP | /INN | IN NORMAL MODE |
| 0 | 1 | /INP | /INN | /INP | /INN | IN NORMAL MODE |
| 1 | 0 | 1 | 1 | 1 | 1 | IN IDLING MODE |
| 1 | 1 | 1 | 1 | 0 | 0 | IN IDLING MODE |

FIG. 16

| IDLE | SEL2~4 | INP1 | INN1 | INP2~4 | INN2~4 | REMARKS |
|---|---|---|---|---|---|---|
| 0 | 0 | INN | INP | INN | INP | IN NORMAL MODE |
| 0 | 1 | INN | INP | INN | INP | IN NORMAL MODE |
| 1 | 0 | 0 | 0 | 0 | 0 | IN IDLING MODE |
| 1 | 1 | 0 | 0 | 1 | 1 | IN IDLING MODE |

FIG. 19

| IDLE | SEL2~4 | Bias_in1 | Bias_in2~4 | INP1 | INN1 | INP2~4 | INN2~4 | REMARKS |
|---|---|---|---|---|---|---|---|---|
| 0 | 0 | bias | bias | /INP | /INN | /INP | /INN | IN NORMAL MODE |
| 0 | 1 | bias | bias | /INP | /INN | /INP | /INN | IN NORMAL MODE |
| 1 | 0 | bias | bias | 1 | 1 | 1 | 1 | IN IDLING MODE |
| 1 | 1 | bias | 0 | 1 | 1 | 1 | 1 | IN IDLING MODE |

FIG. 22

| IDLE | SEL2~4 | Bias_in1 | Bias_in2~4 | INP1 | INN1 | INP2~4 | INN2~4 | REMARKS |
|---|---|---|---|---|---|---|---|---|
| 0 | 0 | bias | bias | INN | INP | INN | INP | IN NORMAL MODE |
| 0 | 1 | bias | bias | INN | INP | INN | INP | IN NORMAL MODE |
| 1 | 0 | bias | bias | 0 | 0 | 0 | 0 | IN IDLING MODE |
| 1 | 1 | bias | 1 | 0 | 0 | 0 | 0 | IN IDLING MODE |

FIG. 23A
FIG. 23B
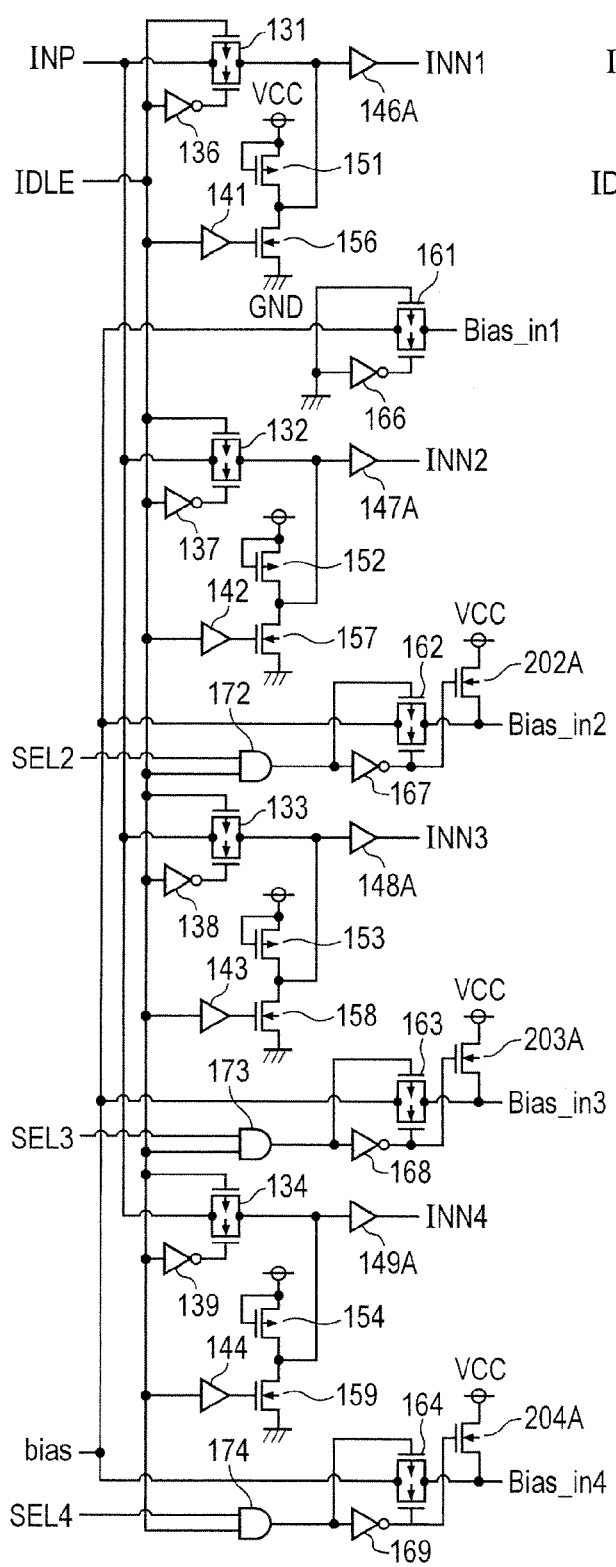
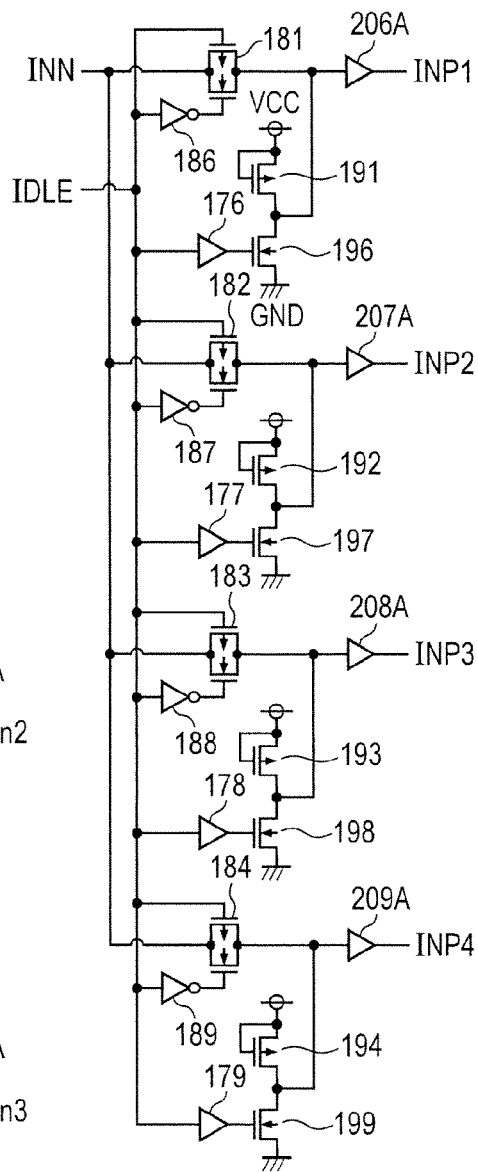

FIG. 25

| IDLE | SEL | TERMINATOR SWITCH | REMARKS |
|---|---|---|---|
| 0 | 0 | OFF | IN NORMAL MODE |
| 0 | 1 | OFF | IN NORMAL MODE |
| 1 | 0 | OFF | IN IDLING MODE |
| 1 | 1 | ON | IN IDLING MODE |

FIG. 29

| IDLE | SEL | CURRENT ADJUSTMENT MOS | REMARKS |
|---|---|---|---|
| 0 | 0 | ON | IN NORMAL MODE |
| 0 | 1 | ON | IN NORMAL MODE |
| 1 | 0 | ON | IN IDLING MODE |
| 1 | 1 | OFF | IN IDLING MODE |

SEMICONDUCTOR DEVICE

CROSS-REFERENCE TO RELATED APPLICATIONS

The disclosure of Japanese Patent Application No. 2012-056959 filed on Mar. 14, 2012 including the specification, drawings, and abstract is incorporated herein by reference in its entirety.

BACKGROUND

The present invention relates to a semiconductor device, and especially to technology which can be utilized suitably in a semiconductor device provided with an output circuit of a differential signal, for example.

In an output circuit of a differential signal, it is important to suppress a variation of a common voltage in order to realize a high speed and long-distance transmission. For example, when a pre-emphasis circuit or a de-emphasis circuit is provided, it is necessary to make the circuit affect only the amplitude of an output signal, without affecting the common voltage.

Published Japanese Unexamined Patent Application No. 2011-71798 (Patent Literature 1) discloses technology which suppresses a variation of a common voltage arising from a pattern of signal data, in an output circuit provided with a de-emphasis function. Specifically, by providing a detector for detecting a data pattern to be transmitted, a current of the output circuit is compensated at the time of the appearance of a specific transmitting data pattern and its reverse pattern.

In an output circuit disclosed by Published Japanese Unexamined Patent Application No. 2011-142382 (Patent Literature 2), when applying de-emphasis to an output signal on the high potential side of differential output signals, a current flowing through a transistor which supplies the de-emphasis current concerned is reduced.

An output circuit disclosed by Published Japanese Unexamined Patent Application No. 2010-283453 (Patent Literature 3) is provided with a circuit which reinforces the pre-emphasis operation of a differential output signal at the time of pre-emphasis, and which switches off a path having performed the pre-emphasis of the differential output signal and switches on a current path between a high-potential-side power source and a low-potential-side power source at the time of de-emphasis.

Furthermore, there are other patent literatures cited below as technology relevant to the technology described above. Published Japanese Unexamined Patent Application No. 2007-60072 (Patent Literature 4) discloses an output circuit provided with a mode for performing an amplitude marginal test with a simple configuration, without influencing a normal operation mode for performing de-emphasis. Published Japanese Unexamined Patent Application No. 2009-171562 (Patent Literature 5) discloses technology in which a comparator circuit is employed as a common voltage adjusting circuit.

(Patent Literature 1) Published Japanese Unexamined Patent Application No. 2011-71798
(Patent Literature 2) Published Japanese Unexamined Patent Application No. 2011-142382
(Patent Literature 3) Published Japanese Unexamined Patent Application No. 2010-283453
(Patent Literature 4) Published Japanese Unexamined Patent Application No. 2007-60072
(Patent Literature 5) Published Japanese Unexamined Patent Application No. 2009-171562

SUMMARY

By the way, in a differential output circuit, when there is no data to be transmitted, the operation mode of the differential output circuit may be set as an idling mode in order to save the power consumption. In the idling mode, an output terminal pair of the differential output circuit becomes equipotential mutually (common voltage). It is necessary to make the common voltage in the idling mode substantially equal to a common voltage of differential signals in the normal mode. However, the technology of adjusting the common voltage in the idling mode is hardly known until now.

Other purposes and new features of the present invention will become clear from the description of the present specification and the accompanying drawings.

An output circuit provided in a semiconductor device according to one embodiment includes a first termination resistor, a second termination resistor, and a drive circuit which flows current through these termination resistors. The output circuit is configured so as to adjust the value of a current which flows through the first termination resistor and the second termination resistor, or the value of resistance of the first termination resistor and the second termination resistor.

According to the embodiment, it is possible to suppress a variation of a common voltage in the idling mode and in the normal mode.

BRIEF DESCRIPTION OF THE DRAWINGS

FIG. 5 is a drawing for explaining operation of a pre-driver and control circuit 22 illustrated in FIG. 2;

FIG. 16 is a drawing for explaining operation of a pre-driver and control circuit 22A illustrated in FIG. 13;

FIG. 19 is a drawing for explaining operation of a pre-driver and control circuit 122 illustrated in FIG. 18;

FIG. 22 is a drawing for explaining operation of a pre-driver and control circuit 122A illustrated in FIG. 21;

FIG. 23A and FIG. 23B are circuit diagrams illustrating a configuration example of the pre-driver and control circuit 122A illustrated in FIG. 21;

FIG. 25 is a drawing illustrating a summary of the operating state of transistors RPS2 and RNS2 employed as a terminator switch;

FIG. 29 is a drawing illustrating a summary of the operating state of a transistor NTC2 employed for current adjustment.

DETAILED DESCRIPTION

Hereinafter, the embodiment is explained in detail with reference to drawings. The same reference symbol will be attached to the same or corresponding part, and the explanation thereof will not be repeated.

Embodiment 1

<<Entire Configuration of a Semiconductor Device 1>>

Figure 1:
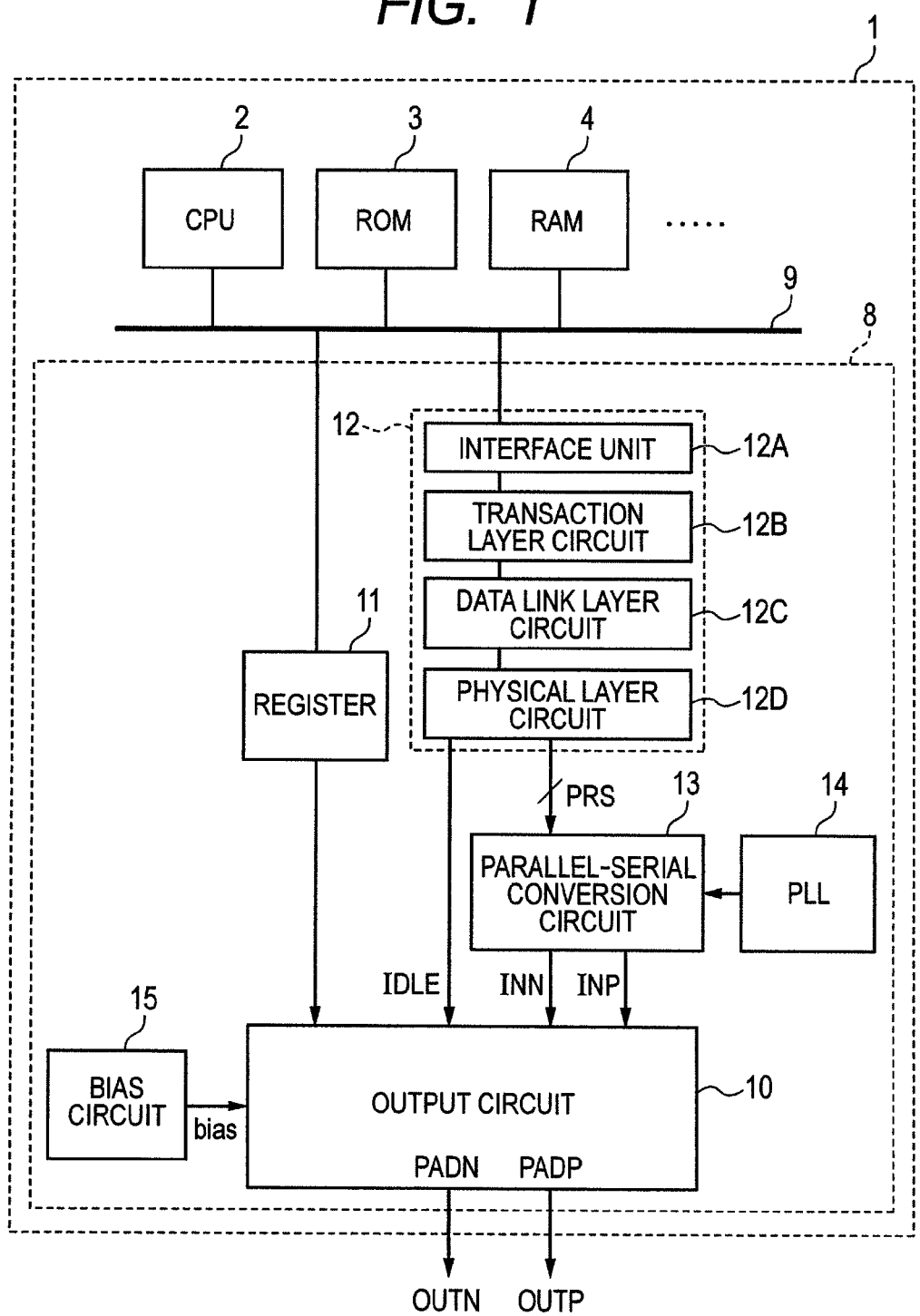
FIG. 1 is a block diagram illustrating roughly a configuration of a semiconductor device 1 according to Embodiment 1.

FIG. 1 is a block diagram illustrating roughly a configuration of a semiconductor device 1 according to Embodiment 1. FIG. 1 illustrates a microcomputer chip as an example of the semiconductor device 1. The semiconductor device 1 includes many functional blocks, such as a CPU (Central Processing Unit) 2, a ROM (Read Only Memory) 3, and a RAM (Random Access Memory) 4. Each functional block is mutually coupled via an internal bus 9.

The semiconductor device 1 further includes a serial communication unit 8 as a functional block for performing high-speed serial communications. The serial communication unit 8 is in conformity with standards, such as LVDS (Low Voltage Differential Signaling), PCI (Peripheral Component Interconnect) Express, SATA (Serial Advanced Technology Attachment), etc. Specifically, the serial communication unit 8 includes a logic circuit unit 12, a parallel-serial conversion circuit 13, a PLL (Phase Locked Loop) circuit 14, an output circuit 10, a register 11, a bias circuit 15, etc.

The logic circuit unit 12 is a circuit for converting output data transferred from the CPU 2, etc. via the bus, into a parallel signal PRS which is in conformity with the standards of the high-speed serial communications. FIG. 1 illustrates the configuration in the case of PCI Express as an example. In the present case, the logic circuit unit 12 includes an interface unit 12A for coupling with the internal bus 9, a transaction layer circuit 12B, a data link layer circuit 12C, and a physical layer circuit 12D.

The parallel-serial conversion circuit 13 converts a parallel signal PRS outputted from the logic circuit unit 12 (the physical layer circuit 12D) into differential serial signals (a positive phase signal INP and a negative phase signal INN). The PLL circuit 14 generates a clock used as a reference of a data rate of the differential serial signals INP and INN.

The output circuit 10 has a normal mode and an idling mode as the operation mode. In the normal mode, the output circuit 10 generates small-amplitude differential serial signals OUTP and OUTN from the inputted differential serial signals INP and INN, and outputs the generated small-amplitude differential serial signals OUTP and OUTN from output terminals PADP and PADN. In the idling mode, the output circuit 10 outputs an idling voltage from the output terminals PADP and PADN (at this time, the output terminals PADP and PADN are at the same potential). The idling voltage is adjusted in advance so that it may become substantially equal to the common voltage of the differential signals outputted in the normal mode (a central value of the positive phase signal OUTP and the negative phase signal OUTN).

The change between the normal mode and the idling mode is executed by means of an idling signal Idle outputted from the logic circuit unit 12 (the physical layer circuit 12D). When there is no data to be transmitted, the logic circuit unit 12 activates the idling signal Idle (or sets the idling signal Idle to a high level (H level) in Embodiment 1), and sets the operation mode of the output circuit 10 to the idling mode.

The register 11 holds the information for controlling the operation of the output circuit 10 in the idling mode. In Embodiment 1, the data held in the register 11 is given by the CPU 2.

The bias circuit 15 generates a bias voltage bias to be supplied to the output circuit 10.

<<A Configuration of the Output Circuit 10>>

Figure 2:
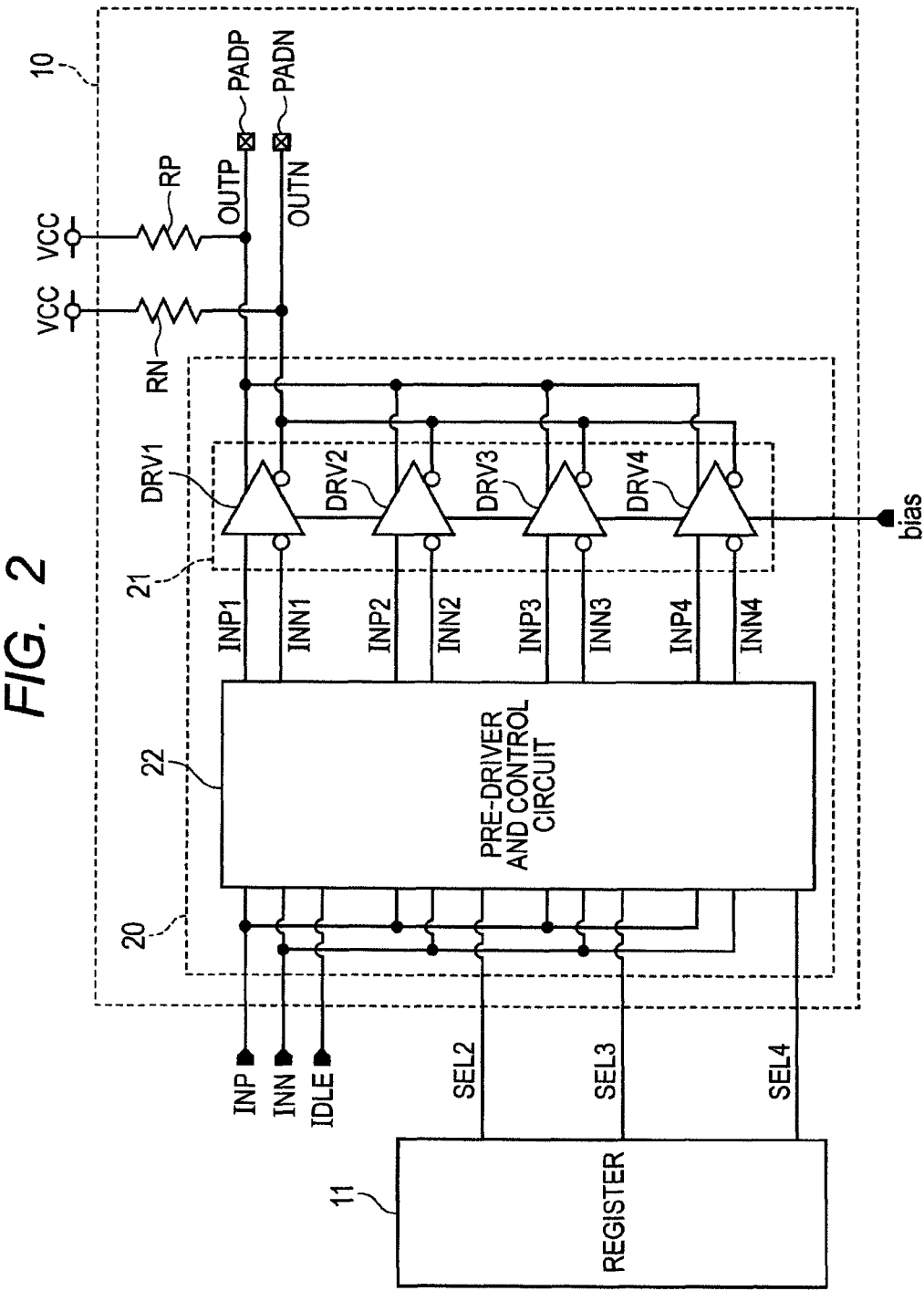
FIG. 2 is a block diagram illustrating a specific configuration of an output circuit 10 illustrated in FIG. 1.

FIG. 2 is a block diagram illustrating a specific configuration of the output circuit 10 illustrated in FIG. 1. As illustrated in FIG. 2, the output circuit 10 includes output terminals PADP and PADN, a termination resistor RP on the positive phase side, a termination resistor RN on the negative phase side, and a drive circuit 20.

The termination resistor RP on the positive phase side is coupled between a power node VCC to which a power supply voltage is applied, and the output terminal PADP on the positive phase side. The termination resistor RN on the negative phase side is coupled between the power node VCC and the output terminal PADN on the negative phase side. Usually, the value of resistance of the termination resistor RP and the value of resistance of the termination resistor RN are designed to be substantially equal.

The drive circuit 20 flows a constant current through one of the termination resistors RP and RN between the power node VCC and a ground node (designated as a reference symbol GND in FIG. 3 and FIG. 4) in the normal mode, corresponding to inputted differential serial signals INP and INN. Accordingly, the output circuit 10 outputs the small-amplitude differential serial signals OUTP and OUTN corresponding to the inputted differential serial signals INP and INN, from the output terminals PADP and PADN.

In the present description, one of the power node VCC and the ground node GND may be called the first power node, and the other may be called the second power node.

In the idling mode, the drive circuit 20 flows a constant current through both termination resistors RP and RN. Accordingly, the output circuit 10 outputs an idling voltage from the output terminals PADP and PADN.

In further detail, the drive circuit 20 includes a pre-driver and control circuit 22 and plural drivers (four drivers in the case of FIG. 2) DRV1-DRV4 coupled in parallel with each other. In the normal mode, each driver DRVi (i=1-4) generates small-amplitude differential serial signals OUTP and OUTN from the corresponding differential signals INPi and INNi received from the pre-driver and control circuit 22, and outputs the generated small-amplitude differential serial signals OUTP and OUTN from the output terminals PADP and PADN.

In the case of FIG. 2, the drive capability of each driver is different. With reference to the drive capability of the driver DRV4, the drive capability of the drivers DRV2 and DRV3 is two times, and the drive capability of the driver DRV1 is five times.

<<A Configuration of Each of the Drivers DRV1-DRV4>>

Figure 3:
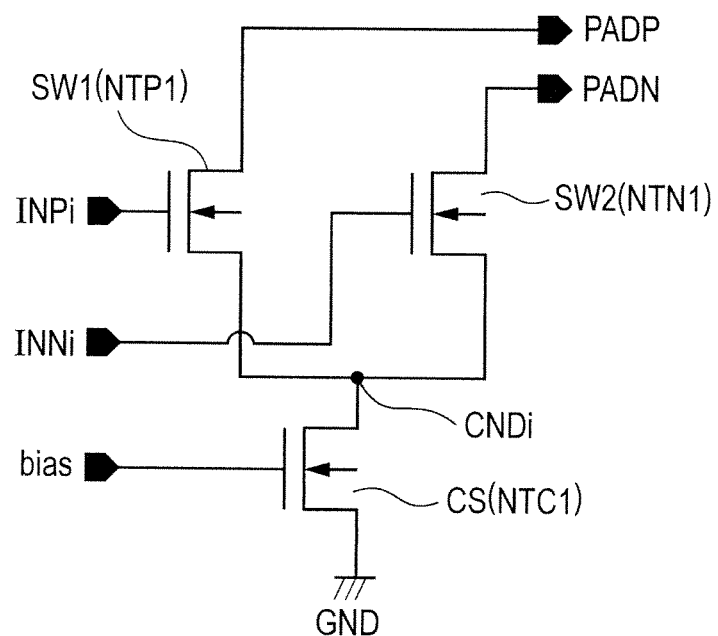
FIG. 3 is a circuit diagram illustrating a configuration of a driver DRV4 illustrated in FIG. 2.

FIG. 3 is a circuit diagram illustrating a configuration of the driver DRV4 illustrated in FIG. 2. As illustrated in FIG. 3, the driver DRV4 (i=4 in FIG. 3) includes a constant current source CS, a first switch SW1, and a second switch SW2.

In the case of FIG. 3, the constant current source CS is comprised of an NMOS (Negative-channel Metal Oxide Semiconductor) transistor NTC1. A predetermined bias voltage bias is applied to a gate the transistor NTC1. A source of the transistor NTC1 is coupled to the ground node GND.

In the case of FIG. 3, the first switch SW1 is formed by an NMOS transistor NTP1. A source of the transistor NTP1 is coupled to a drain of the transistor NTC1 (a connection node CNDi), and a drain of the transistor NTP1 is coupled to the output terminal PADP on the positive phase side. A corresponding input signal INPi (i=4 in the present case) is inputted to a gate of the transistor NTP1, from the pre-driver and control circuit 22.

In the case of FIG. 3, the second switch SW2 is formed by an NMOS transistor NTN1. A source of the transistor NTN1 is coupled to the drain of the transistor NTC1 (the connection node CNDi), and a drain of the transistor NTN1 is coupled to the output terminal PADN on the negative phase side. A corresponding input signal INNi (i=4 in the present case) is inputted to a gate of the transistor NTN1, from the pre-driver and control circuit 22.

Figure 4:
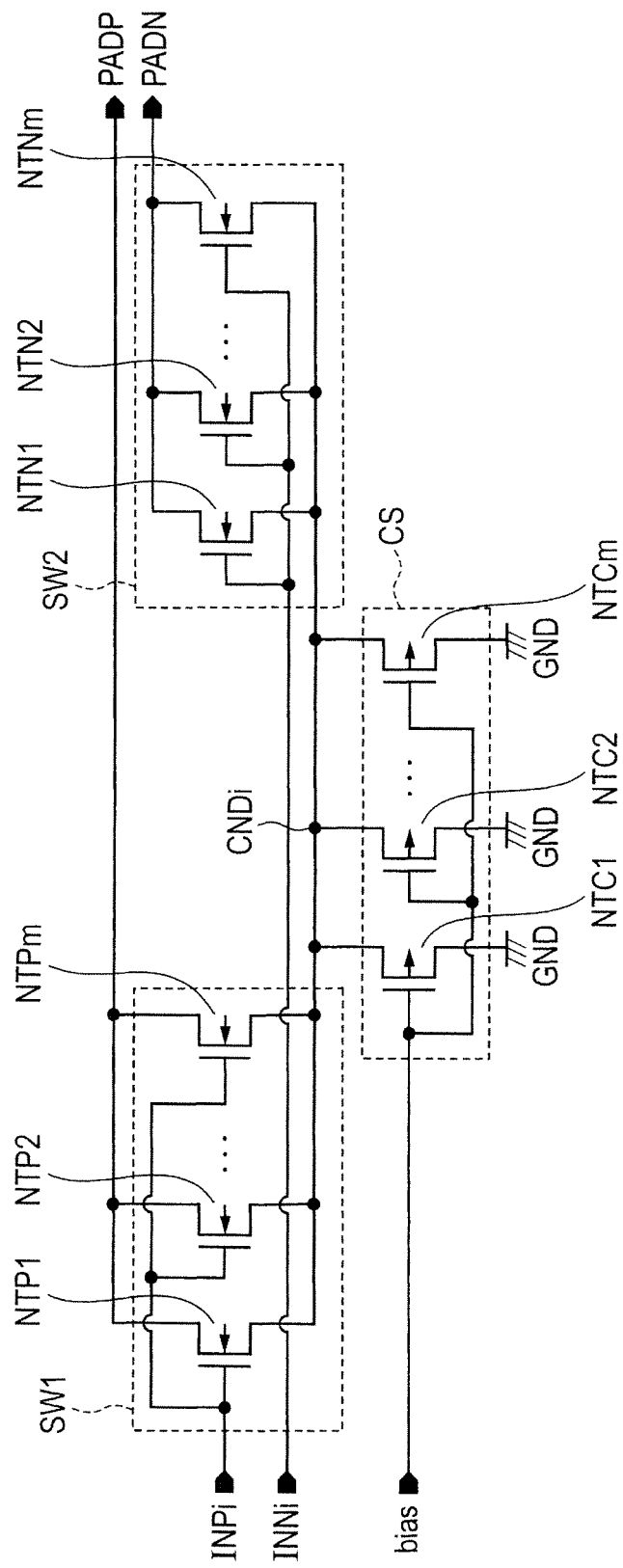
FIG. 4 is a circuit diagram illustrating a configuration of drivers DRV1-DRV3 illustrated in FIG. 2.

FIG. 4 is a circuit diagram illustrating a configuration of the drivers DRV1-DRV3 illustrated in FIG. 2. As illustrated in FIG. 4, the driver DRVi (i=1-3 in FIG. 4) includes a constant current source CS, a first switch SW1, and a second switch SW2.

The constant current source CS is comprised of m-piece parallel-coupled NMOS transistors NTC1-NTCm (m is 2 or a greater integer), to gates of which a predetermined bias voltage bias is applied. As for the driver DRV1, m=5 and as for the drivers DRV2 and DRV3, m=2. A source of each of the transistors NTC1-NTCm is coupled to the ground node GND, a drain of each of the transistors NTC1-NTCm is coupled to a connection node CNDi in common (a connection node CND1 is provided to the driver DRV1, a connection node CND2 is provided to the driver DRV2, and a connection node CND3 is provided to the driver DRV3).

The first switch SW1 is formed by m-piece NMOS transistors NTP1-NTPm coupled in parallel. As for the driver DRV1, m=5 and as for the drivers DRV2 and DRV3, m=2. A source of each of the transistors NTP1-NTPm is coupled to the connection node CNDi, and a drain of each of the transistors NTP1-NTPm is coupled to the output terminal PADP on the positive phase side. A corresponding input signal INPi (i=1-3 in the present case) is inputted to a gate of each of the transistors NTP1-NTPm from the pre-driver and control circuit 22 (an input signal INP1 is inputted to the driver DRV1, an input signal INP2 is inputted to the driver DRV2, and an input signal INP3 is inputted to the driver DRV3).

The second switch SW2 is formed by m-piece NMOS transistors NTNi-NTNm coupled in parallel. As for the driver DRV1, m=5 and as for the drivers DRV2 and DRV3, m=2. A source of each of the transistor NTNi-NTNm is coupled to the connection node CNDi, and a drain of each of the transistors NTNi-NTNm is coupled to the output terminal PADN on the negative phase side. A corresponding input signal INNi (i=1-3 in the present case) is inputted to a gate of each of the transistors NTN1-NTNm from the pre-driver and control circuit 22 (an input signal INN1 is inputted to the driver DRV1, an input signal INN2 is inputted to the driver DRV2, and an input signal INN3 is inputted to the driver DRV3).

The transistors NTP1-NTPm, NTNi-NTNm, and NTC1-NTCm illustrated in FIG. 3 and FIG. 4 are substantially equal in size and property with each other. Therefore, the drive capability is determined by the number of the transistors coupled in parallel. It is also possible to adjust the drive capability by means of gate width, instead of the number of transistors.

<<Operation of the Pre-Driver and Control Circuit 22>>

With reference to FIG. 2 again, the pre-driver and control circuit 22 receives the idling signal IDLE from the logic circuit unit 12 (the physical layer circuit 12D) illustrated in FIG. 1 and the differential serial signals INP and INN from the parallel-serial conversion circuit 13. The pre-driver and control circuit 22 further receives selection signals SEL2-SEL4 corresponding to the value of the register 11 set up in advance. The selection signals SEL2-SEL4 correspond to the drivers DRV2-DRV4, respectively. In response to these signals, the pre-driver and control circuit 22 outputs signals (INP1, INN1)-(INP4, INN4) to the drivers DRV1-DRV4, respectively.

FIG. 5 is a drawing for explaining the operation of the pre-driver and control circuit 22 illustrated in FIG. 2. In FIG. 5, a logical level at a low level (L level) is expressed by "0", and a logical level at a high level (H level) is expressed by "1."

With reference to FIG. 2-FIG. 5, operation in the normal mode (when the idling signal IDLE is "0") is explained first. In this case, a signal /INP, obtained by inverting an inputted positive phase signal INP, is inputted as the corresponding signals INP1-INP4 to the gate of each transistor which forms the first switch SW1 provided in the drivers DRV1-DRV4. A signal /INN, obtained by inverting an inputted negative phase signal INN, is inputted as the corresponding signals INN1-INN4 to the gate of each transistor which forms the second switch SW2 provided in the drivers DRV1-DRV4. The signal inputted to each of the drivers DRV1-DRV4 does not depend on the signal level of the selection signals SEL2-SEL4 held in the register 11.

Therefore, when the positive phase input signal INP is H level and the negative phase input signal INN is L level, the first switch SW1 becomes in a non-conductive state, and the second switch SW2 becomes in a conductive state. As a result, the positive phase signal OUTP outputted from the output terminal PADP is set to H level, and the negative phase signal OUTN outputted from the output terminal PADN is set to L level. When the positive phase input signal INP is L level and the negative phase input signal INN is H level, the first switch SW1 becomes in a conductive state, and the second switch SW2 becomes in a non-conductive state. As a result, the positive phase signal OUTP outputted from the output terminal PADP is set to L level, and the negative phase signal OUTN outputted from the output terminal PADN is set to H level.

Next, operation in the idling mode (when the idling signal IDLE is "1") is explained. In this case, a signal of H level ("1") is inputted as the input signal INP1 to the gate of each transistor which forms the first switch SW1 provided in the driver DRV1. A signal of H level ("1") is inputted as the input signal INN1 to the gate of each transistor which forms the second switch SW2 provided in the driver DRV1. The signals INP1 and INN1 inputted to the driver DRV1 do not depend on the setting value of the register 11. As a result, both of the first switch SW1 and the second switch SW2, provided in the driver DRV1, become in a conductive state.

The signals inputted to the drivers DRV2-DRV4 are different respectively, according to the value of the selection signals SEL2-SEL4 supplied from the register 11. Ina specific driver DRVi (i=2-4) corresponding to the selection signal SELi of H level ("1"), a signal of L level ("0") is inputted as the input signal INPi to each transistor which forms the first switch SW1, and a signal of L level ("0") is inputted as the input signal INNi to each transistor which forms the second switch SW2. As a result, both of the first switch SW1 and the second switch SW2, provided in the specific driver DRVi (i=2-4) corresponding to the selection signal SELi of H level, become in a non-conductive state.

In a specific driver DRVi (i=2-4) corresponding to the selection signal SELi of L level ("0"), on the other hand, a signal of H level ("1") is inputted as the input signal INPi to each transistor which forms the first switch SW1, and a signal of H level ("1") is inputted as the input signal INNi to each transistor which forms the second switch SW2. As a result, both of the first switch SW1 and the second switch SW2, provided in the specific driver DRVi (i=2-4) corresponding to the selection signal SELi of L level, become in a conductive state.

The setting value of the register 11, that is, whether the selection signals SEL2-SEL4 are set to H level "1" or not, is determined according to the magnitude of the idling voltage outputted in the idling mode. As will be explained in detail with reference to FIG. 7-FIG. 12, when the selection signals SEL2-SEL4 are all set to L level ("0") and a constant current is supplied to the termination resistors RP and RN from all the drivers DRV1-DRV4 in the idling mode, the idling voltage may become lower than the common voltage in the normal mode. In this case, it is set such that the current is not flowed through the termination resistors RP and RN from a part of (one or more) specific drivers, and that the current is flowed through termination resistors RP and RN from the remaining one or more drivers. Accordingly, it is set such that the current which flows through the termination resistors RP and RN is reduced, and that the idling voltage becomes substantially equal to the common voltage in the normal mode.

<<A Configuration Example of the Pre-Driver and Control Circuit 22>>

Figure 6A:
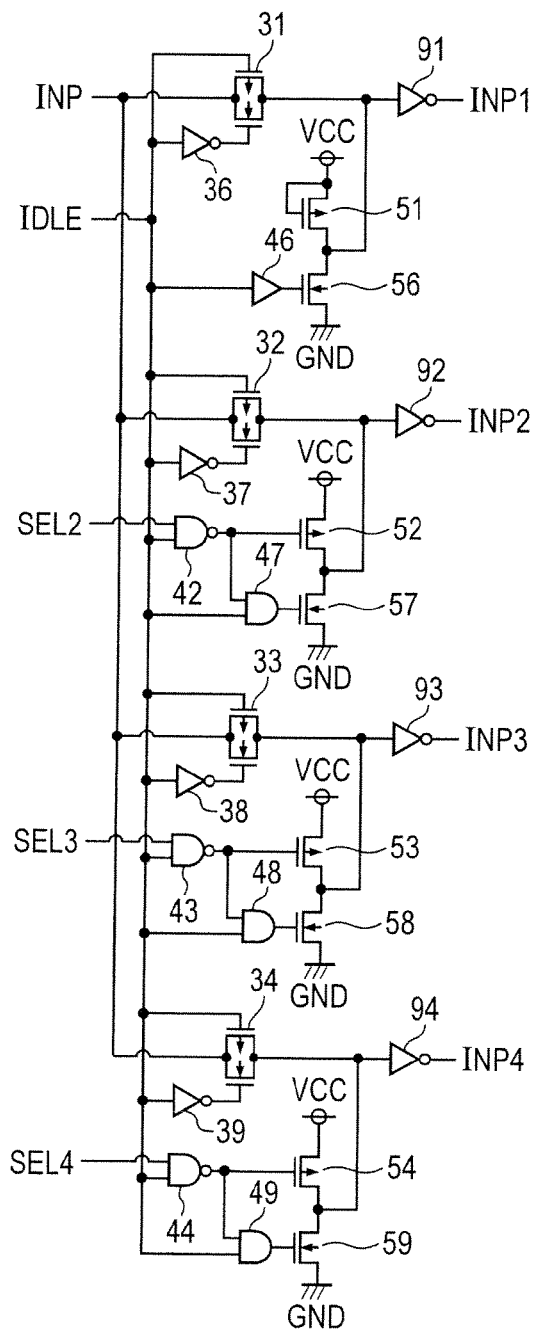
FIG. 6A and FIG. 6B are circuit diagrams illustrating a configuration example of the pre-driver and control circuit 22 illustrated in FIG. 2.
Figure 6B:
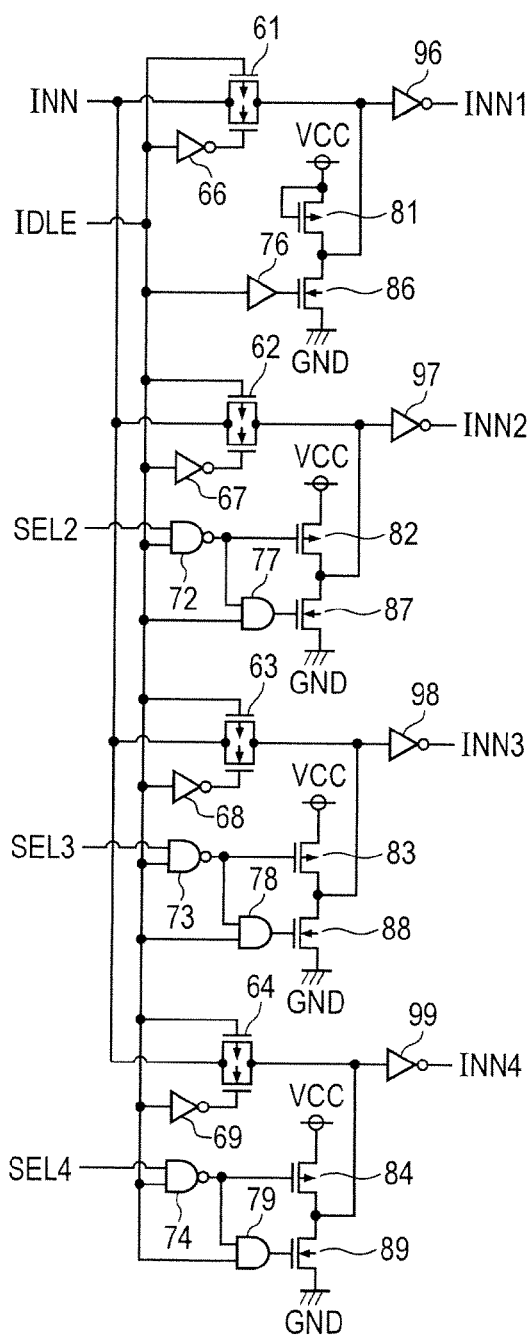

FIG. 6A and FIG. 6B are circuit diagrams illustrating a configuration example of the pre-driver and control circuit 22 illustrated in FIG. 2. FIG. 6A illustrates a circuit part which receives the positive phase input signal INP and generates the signals INP1-INP4 to be outputted to the first switch SW1 included in each of the drivers DRV1-DRV4, respectively.

FIG. 6B illustrates a circuit part which receives the negative phase input signal INN and generates the signals INN1-INN4 to be outputted to the second switch SW2 included in each of the drivers DRV1-DRV4, respectively.

As illustrated in FIG. 6A, the pre-driver and control circuit 22 includes transmission gates 31-34, inverters 36-39 and 91-94, NAND gates 42-44, a buffer 46, AND gates 47-49, PMOS (Positive-channel Metal Oxide Semiconductor) transistors 51-54, and NMOS transistors 56-59.

The inputted positive phase signal INP is fed to the inverters 91-94 respectively via the transmission gates 31-34. The idling signal IDLE is inputted to a gate of a PMOS transistor which forms each of the transmission gates 31-34. A signal obtained by inverting the idling signal IDLE with the inverters 36-39 is respectively inputted to a gate of an NMOS transistor which forms each of the transmission gates 31-34.

The PMOS transistor 51 and the NMOS transistor 56 are coupled between the power node VCC and the ground node GND in this order, and a connection node of these transistors 51 and 56 is coupled to an input node of the inverter 91. A gate of the transistor 51 is coupled to the power node VCC. Therefore, the transistor 51 is always in OFF state. The idling signal IDLE is inputted to a gate of the transistor 56 via the buffer 46.

The PMOS transistor 52 and the NMOS transistor 57 are coupled between the power node VCC and the ground node GND in this order, and a connection node of these transistors 52 and 57 is coupled to an input node of the inverter 92. The NAND gate 42 outputs a NAND operation result of the idling signal IDLE and the selection signal SEL2 to a gate of the transistor 52. The AND gate 47 outputs an AND operation result of the idling signal IDLE and the output of the NAND gate 42 to a gate of the transistor 57.

The PMOS transistor 53 and the NMOS transistor 58 are coupled between the power node VCC and the ground node GND in this order, and a connection node of these transistors 53 and 58 is coupled to an input node of the inverter 93. The NAND gate 43 outputs a NAND operation result of the idling signal IDLE and the selection signal SEL3 to a gate of the transistor 53. The AND gate 48 outputs an AND operation result of the idling signal IDLE and the output of the NAND gate 43 to a gate of the transistor 58.

The PMOS transistor 54 and the NMOS transistor 59 are coupled between the power node VCC and the ground node GND in this order, and a connection node of these transistors 54 and 59 is coupled to an input node of the inverter 94. The NAND gate 44 outputs a NAND operation result of the idling signal IDLE and the selection signal SEL4 to a gate of the transistor 54. The AND gate 49 outputs an AND operation result of the idling signal IDLE and the output of the NAND gate 44 to a gate of the transistor 59.

The signals INP1-INP4 are outputted from the inverters 91-94 to the corresponding drivers DRV1-DRV4, respectively.

According to the configuration, when the idling signal IDLE is L level ("0") (in the normal mode), the transmission gates 31-34 are conducted. At this time, the PMOS transistors 51-54 and the NMOS transistors 56-59 are set to OFF state, altogether. As a result, from the inverters 91-94, a signal /INP, obtained by inverting the positive phase input signal INP, is outputted, respectively, as the signals INP1-INP4 to the corresponding drivers DRV1-DRV4.

Next, operation when the idling signal IDLE is H level ("1") (in the idling mode) is explained. In this case, the transmission gates 31-34 are in a non-conductive state. The transistor 56 is set to ON state, accordingly, the signal INP1 of H level ("1") is outputted from the inverter 91 to the driver DRV1. The signals INP2-INP4 are different, respectively, according to the selection signals SEL2-SEL4.

When the selection signal SEL2 is H level ("1"), the transistor 52 is set to ON state and the transistor 57 is set to OFF state, accordingly, the signal INP2 of L level ("0") is outputted from the inverter 92 to the driver DRV2. When the selection signal SEL2 is L level ("0"), the transistor 52 is set to OFF state and the transistor 57 is set to ON state, accordingly, the signal INP2 of H level ("1") is outputted from the inverter 92 to the driver DRV2.

When the selection signal SEL3 is H level ("1"), the transistor 53 is set to ON state and the transistor 58 is set to OFF state, accordingly, the signal INP3 of L level ("0") is outputted from the inverter 93 to the driver DRV3. When the selection signal SEL3 is L level ("0"), the transistor 53 is set to OFF state and the transistor 58 is set to ON state, accordingly, the signal INP3 of H level ("1") is outputted from the inverter 93 to the driver DRV3.

When the selection signal SEL4 is H level ("1"), the transistor 54 is set to ON state and the transistor 59 is set to OFF state, accordingly, the signal INP4 of L level ("0") is outputted from the inverter 94 to the driver DRV4. When the selection signal SEL4 is L level ("0"), the transistor 54 is set to OFF state and the transistor 59 is set to ON state, accordingly, the signal INP4 of H level ("1") is outputted from the inverter 94 to the driver DRV4.

As illustrated in FIG. 6B, the pre-driver and control circuit 22 further includes transmission gates 61-64, inverters 66-69 and 96-99, NAND gates 72-74, a buffer 76, AND gates 77-79, PMOS transistors 81-84, and NMOS transistors 86-89.

The circuit configuration illustrated in FIG. 6B is the same as that illustrated in FIG. 6A. That is, the transmission gates 61-64 illustrated in FIG. 6B correspond to the transmission gates 31-34 illustrated in FIG. 6A, respectively. The inverters 66-69 and 96-99 illustrated in FIG. 6B correspond to the inverters 36-39 and 91-94 illustrated in FIG. 6A, respectively. The NAND gates 72-74, the buffer 76, and the AND gates 77-79 illustrated in FIG. 6B correspond to the NAND gates 42-44, the buffer 46, and the AND gates 47-49 illustrated in FIG. 6A, respectively. The PMOS transistors 81-84 and the NMOS transistors 86-89 illustrated in FIG. 6B correspond to the PMOS transistors 51-54 and the NMOS transistors 56-59 illustrated in FIG. 6A, respectively. The signals INN1-INN4 illustrated in FIG. 6B correspond to the signals INP1-INP4 illustrated in FIG. 6A, respectively. Therefore, the circuit operation of FIG. 6B is the same as the circuit operation of FIG. 6A; accordingly, the explanation thereof is not repeated.

<<Reason for Adjusting a Current which Flows Through the Termination Resistors RP and RN>>

The following explains in more detail about the reason for adjusting a current which flows through the termination resistors RP and RN illustrated in FIG. 2, by means of the selection signals SEL2-SEL4 in the idling mode.

Figure 7:
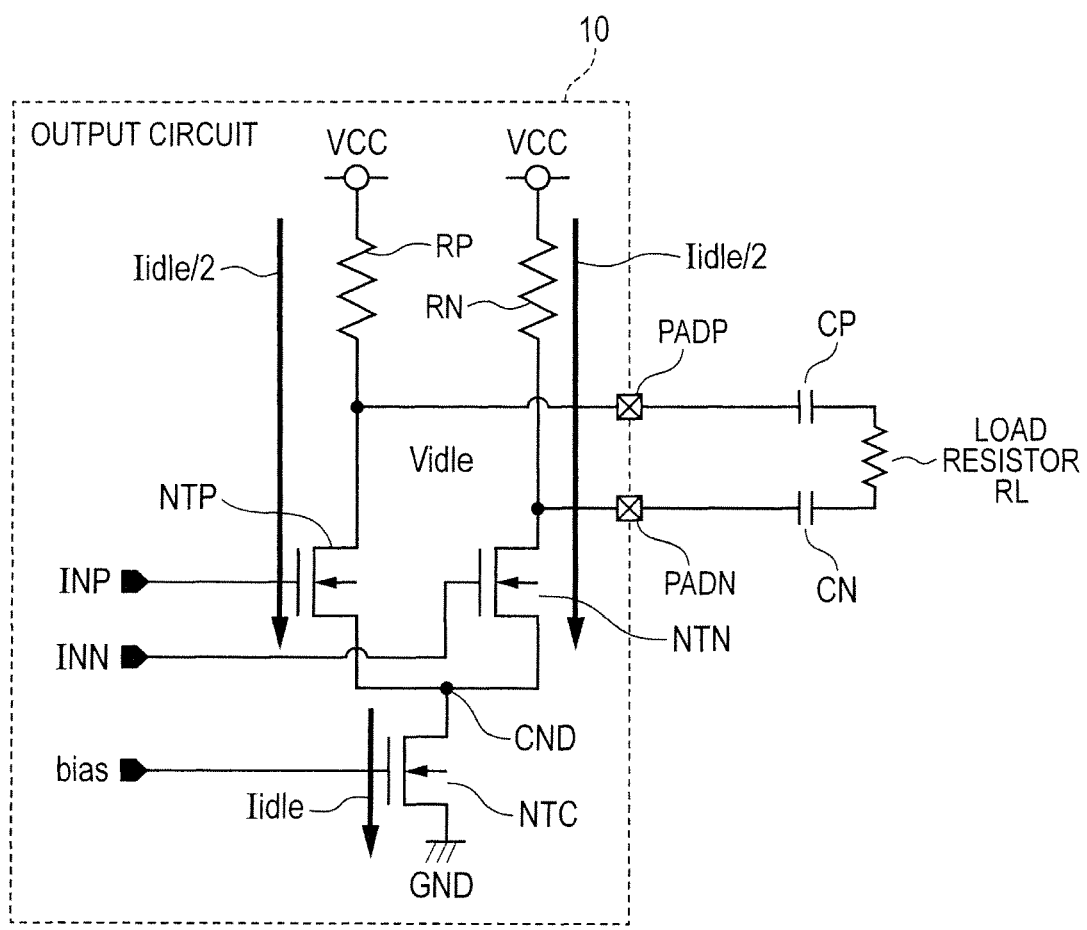
FIG. 7 is a drawing for explaining a current which flows through the output circuit 10 in an idling mode.

FIG. 7 explains a current which flows through the output circuit 10 in the idling mode. For simplicity, FIG. 7 illustrates an example in which the driver group 21 which composes the drive circuit 20 illustrated in FIG. 2 is represented by one driver (NMOS transistors NTP, NTN, and NTC) That is, the transistor NTP serving as the first switch is coupled between the output terminal PADP and a connection node CND. A positive phase signal INP is inputted to a gate of the transistor NTP. The transistor NTN serving as the second switch is coupled between the output terminal PADN and the connection node CND. A negative phase signal INN is inputted to a gate of the transistor NTN. The transistor NTC serving as the constant current source is coupled between the connection node CND and the ground node GND. A bias voltage bias is applied to a gate of the transistor NTC. The output terminals PADP and PADN are AC-coupled to a load resistor RL via capacitors CP and CN, respectively.

In the idling mode, both of the input signals INP and INN become H level, and both of the transistors NTP and NTN are set to ON state. When it is assumed that a constant current Iidle flows through the transistor NTC, a current which flows through the termination resistors RP and RN becomes Iidle/2. When it is assumed that the value of resistance of each of the termination resistors RP and RN is Re and that the value of resistance of the transistors NTP and NTN is Ron, the idling voltage Vidle outputted from the output terminals PADP and PADN is expressed by $$Vidle = Vcc - Iidle \times Re/2 \qquad (1).$$

In Equation (1), it is assumed that the power supply voltage is Vcc.

Figure 8:
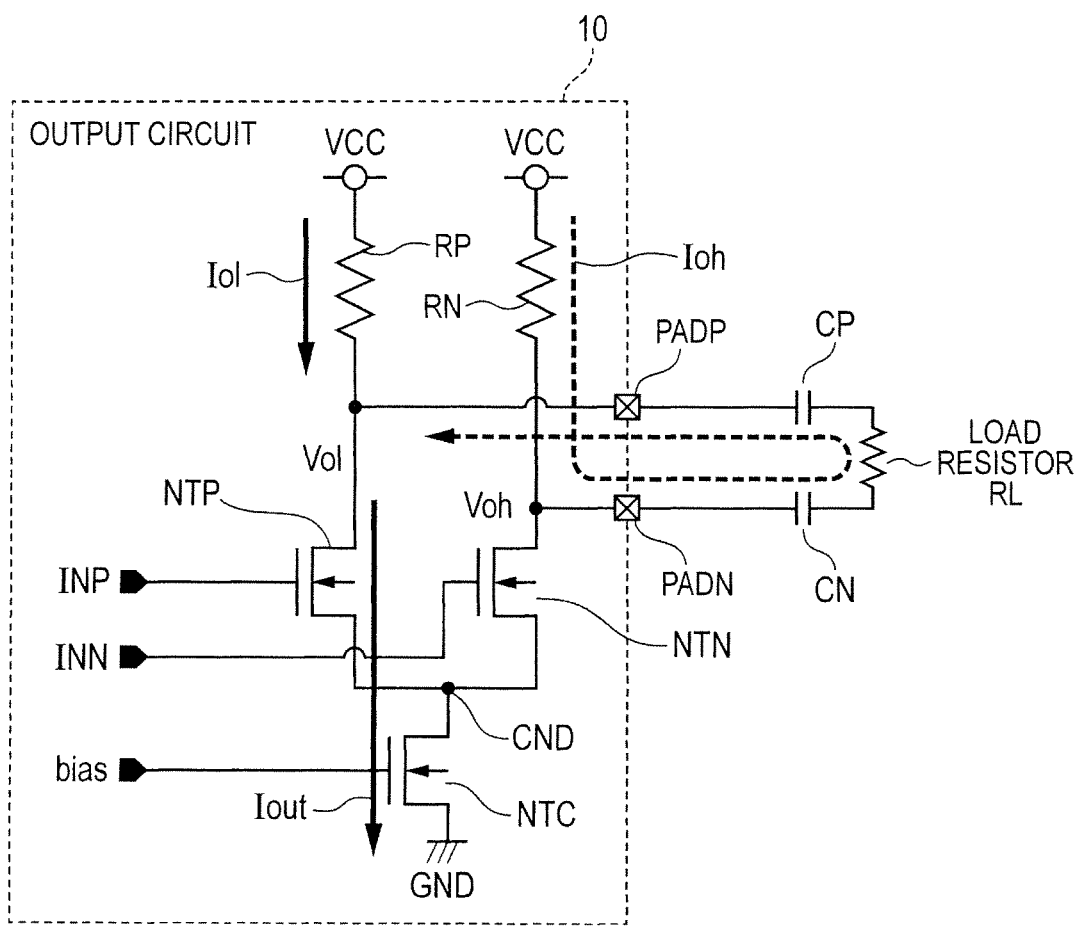
FIG. 8 is a drawing for explaining a current which flows through the output circuit 10 in a normal mode.

FIG. 8 explains a current which flows through the output circuit 10 in the normal mode. The circuit configuration illustrated in FIG. 8 is the same as that illustrated in FIG. 7.

In the normal mode, one of the input signals INP and INN becomes H level and the other becomes L level; accordingly, the transistor NTP is set to ON state when the input signal INP is H level and the transistor NTN is set to ON state when the input signal INN is H level. FIG. 8 illustrates the case where the input signal INP is H level and the input signal INN is L level; that is when the transistor NTP is set to ON state and the transistor NTN is set to OFF state. In the present case, a current Iol flows through the termination resistor RP. On the other hand, when the input signals INP and INN change, a current Ioh flows transitionally through the termination resistor RN. The current Ioh reduces soon to 0. Therefore, when the transient state is excluded, the current Iol which flows through the termination resistor RP is substantially equal to the constant current Iout which flows through the transistor NTC. In this case, the voltage Vol of the output terminal PADP is expressed by $$Vol = Vcc - Iout \times Re \qquad (2).$$

The voltage Voh of the output terminal PADN is equal to the power supply voltage Vcc.

On the basis of the explanation made above in relevant to FIGS. 7 and 8, the problem which might arise when the amount of current flowing through the termination resistors RP and RN in the idling mode is not adjusted (comparative example) is explained first.

Figure 9:
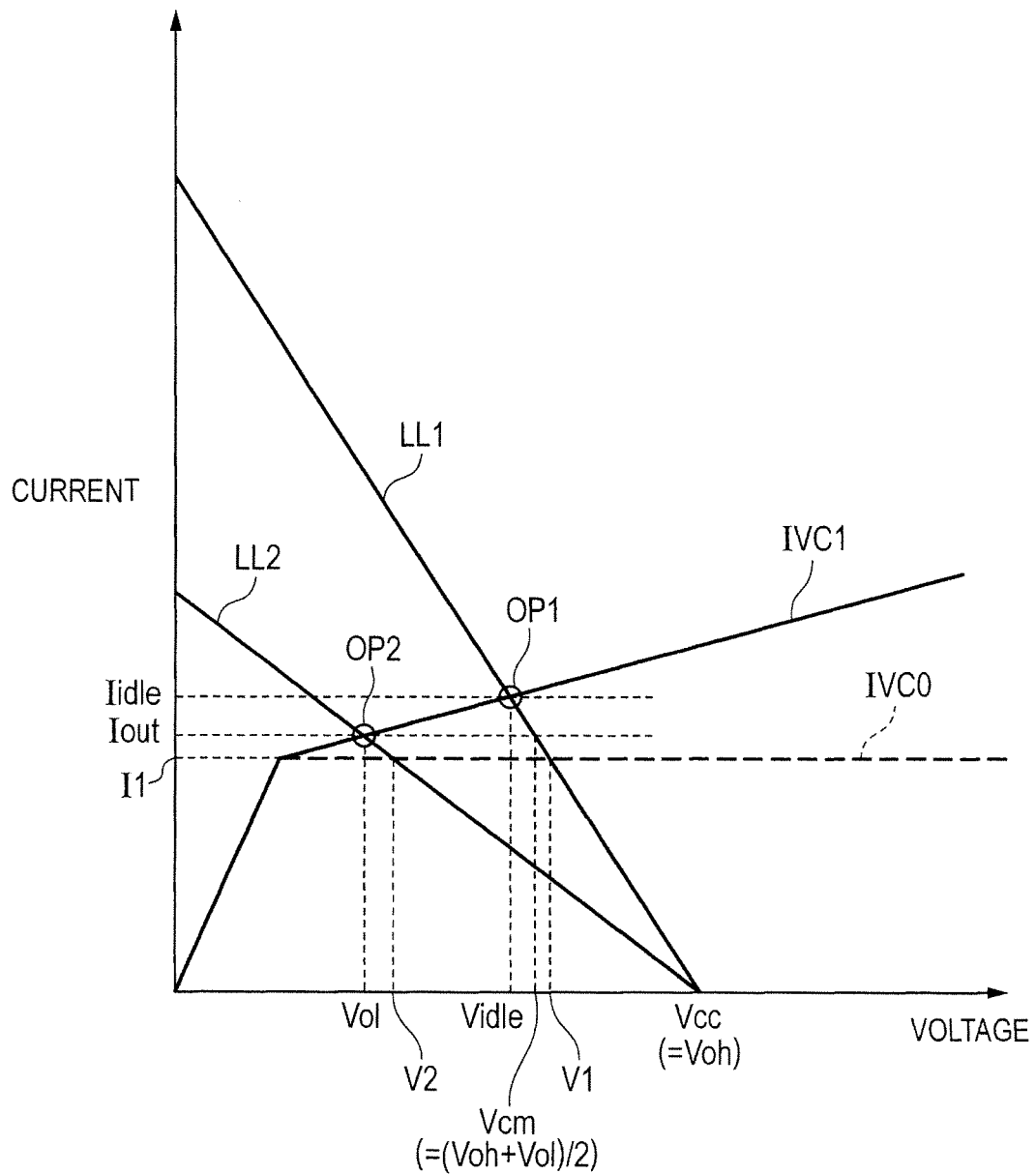
FIG. 9 is a drawing illustrating the current-voltage characteristic (comparative example) of a transistor NTC employed for a constant current source.

FIG. 9 illustrates the current-voltage characteristic (comparative example) of the transistor NTC employed for the constant current source. FIG. 9 illustrates the ideal current-voltage characteristic IVC0 without a channel length modulation effect and the current-voltage characteristic IVC1 with a pronounced channel length modulation effect. It should be noted, however, that the current-voltage characteristic in the idling mode illustrated in FIG. 9 (comparative example) indicates the case where the amount of current flowing through the termination resistors RP and RN is not adjusted, in contrast to the present embodiment.

As illustrated in FIG. 9, in the idling mode, an intersection of a load line LL1 expressed by Equation (1) and the current-voltage characteristic IVC1 exhibits an operating point OP1 (current Iidle, voltage Vidle) of the transistor NTC. In the normal mode, an intersection of a load line LL2 expressed by Equation (2) and the current-voltage characteristic IVC1 exhibits an operating point OP2 (current Iout, voltage Vol) of the transistor NTC. Because of the channel length modulation effect, the idling voltage Vidle in the idling mode becomes lower than the common voltage Vcm (Vcm=(Voh+Vol)/2) in the normal mode.

In the case of the ideal current-voltage characteristic IVC0 without the channel length modulation effect, the operating point in the idling mode is an intersection of the current-voltage characteristic IVC0 and the load line LL1, and is expressed by a point (current I1, voltage V1) in FIG. 9. The operating point in the normal mode is an intersection of the current-voltage characteristic IVC0 and the load line LL2, and is expressed by a point (current I1, voltage V2) in FIG. 9. Since the voltage V1 is equal to (Vcc+V2)/2, the idling voltage becomes equal to the common voltage in the normal mode, when there is no channel length modulation effect.

Figure 10:
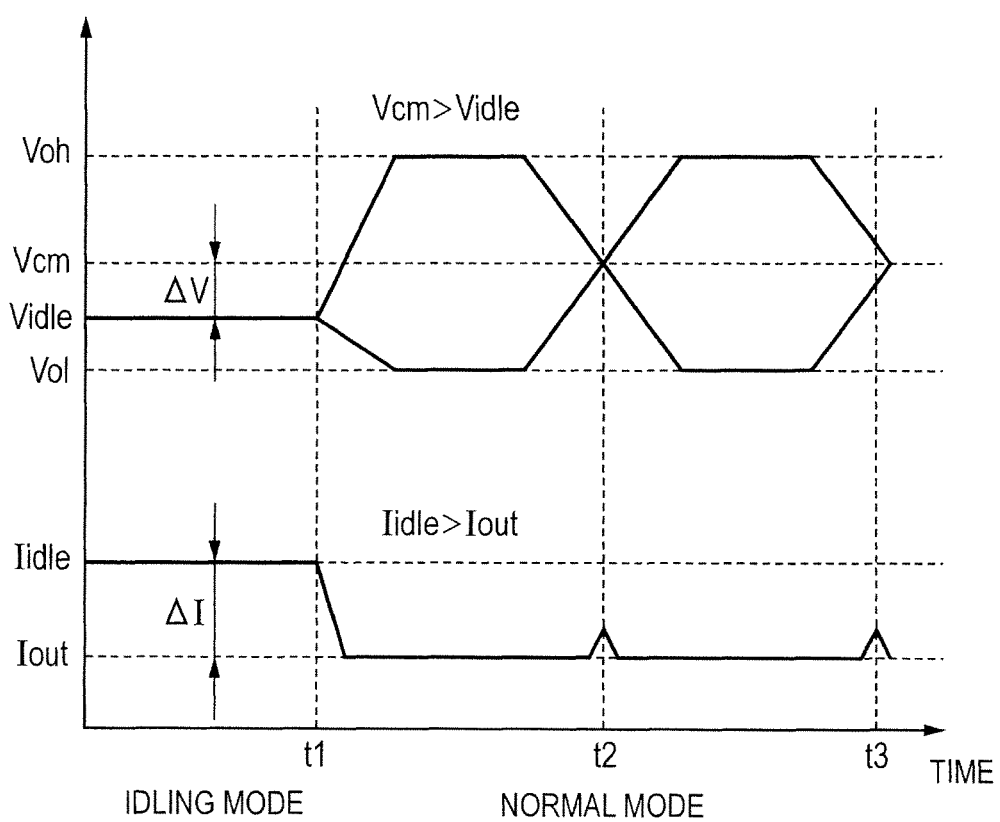
FIG. 10 is a drawing illustrating signal wave forms outputted from output terminals PADP and PADN (comparative example)

FIG. 10 illustrates signal wave forms outputted from the output terminals PADP and PADN (comparative example).

As illustrated in FIG. 10, a period before time t1 is the idling mode and a period after time t1 is the normal mode. At time t2 and t3, the logic of the output signals is reversed. It should be noted, however, that the signal wave form in the idling mode illustrated in FIG. 10 (comparative example) indicates the case where the amount of current flowing through the termination resistors RP and RN is not adjusted, in contract to the description made above.

As illustrated in FIG. 10, when the amount of current flowing through the termination resistors RP and RN in the idling mode is not adjusted, the idling voltage Vidle in the idling mode becomes lower than the common voltage Vcm in the normal mode (voltage difference ΔV of FIG. 10). The constant current Iidle which flows through the transistor NTC in the idling mode becomes larger than the constant current Iout which flows through the transistor NTC in the normal mode (current difference ΔI of FIG. 10). In this way, when the common voltage changes in the idling mode and in the normal mode, it is likely that the common voltage is not kept within the variation range of the common voltage specified by the standard of high-speed serial communications.

The following explains the advantage of adjusting the amount of current flowing through the termination resistors RP and RN in the idling mode as in the present embodiment.

Figure 11:
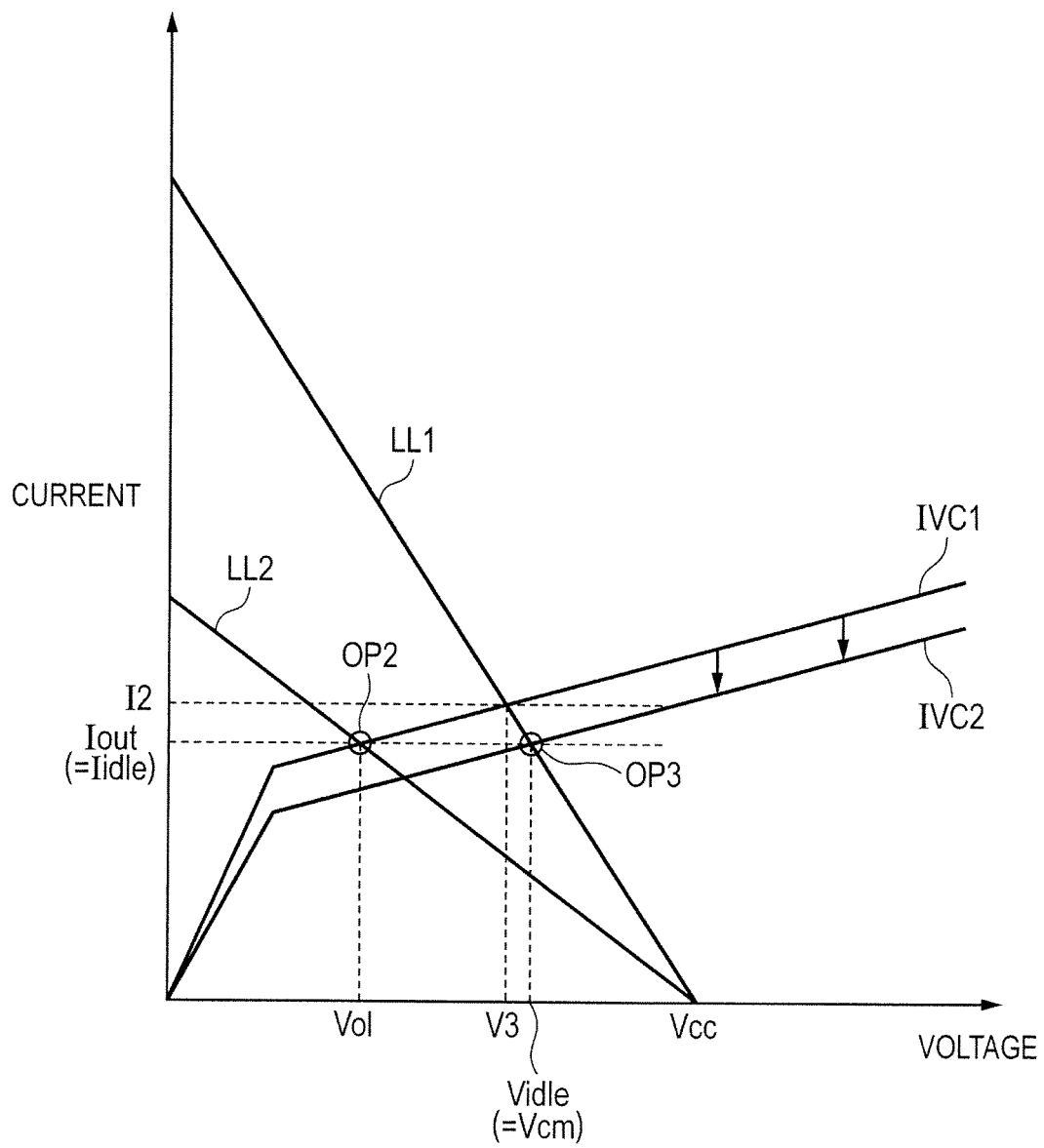
FIG. 11 is a drawing illustrating the current-voltage characteristic of a transistor NTC employed for a constant current source in the present embodiment.

FIG. 11 illustrates the current-voltage characteristic of the transistor NTC employed for the constant current source in the present embodiment. FIG. 11 illustrates a current-voltage characteristic IVC2 in the idling mode and a current-voltage characteristic IVC1 in the normal mode (the same as the current-voltage characteristic IVC1 illustrated in FIG. 9). The current-voltage characteristic IVC2 in the idling mode has a smaller current than the current-voltage characteristic IVC1 in the normal mode. Specifically, as explained with reference to FIG. 2-FIG. 6, it is set such that, in the idling mode, a current to the termination resistors RP and RN is not supplied from a specific part of drivers among the plural drivers DRV1-DRV4 coupled in parallel.

In FIG. 11, the operating point OP2 (current Iout, voltage Vol) in the normal mode is given by an intersection of the current-voltage characteristic IVC1 and the load line LL2 expressed by Equation (2) described above. The operating point OP3 (current Iidle, voltage Vidle) in the idling mode is given by an intersection of the current-voltage characteristic IVC2 and the load line LL1 expressed by Equation (1) described above. At this time, the current-voltage characteristic IVC2 in the idling mode is adjusted so that the idling voltage Vidle in the idling mode may become substantially equal to the common voltage Vcm (Vcm=(Voh+Vol)/2) in the normal mode. Specifically, the idling voltage Vidle in the idling mode and the common voltage Vcm in the normal mode are detected and compared with each other, by changing the setting value of the register 11 by the command from the CPU 2 illustrated in FIG. 1. The setting value of the register 11 when both become nearly equal is stored in a memory as a firmware.

After the adjustment of the current-voltage characteristic IVC2, the current Iidle which flows through the transistor NTC in the idling mode becomes substantially equal to the current Iout which flows through the transistor NTC in the normal mode. Compared with the operating point (current I2, voltage V3) in the idling mode before the adjustment, in the operating point after the adjustment, the current value decreases from I2 to Iidle (=Iout), and the voltage value increases from V3 to Vidle.

Figure 12:
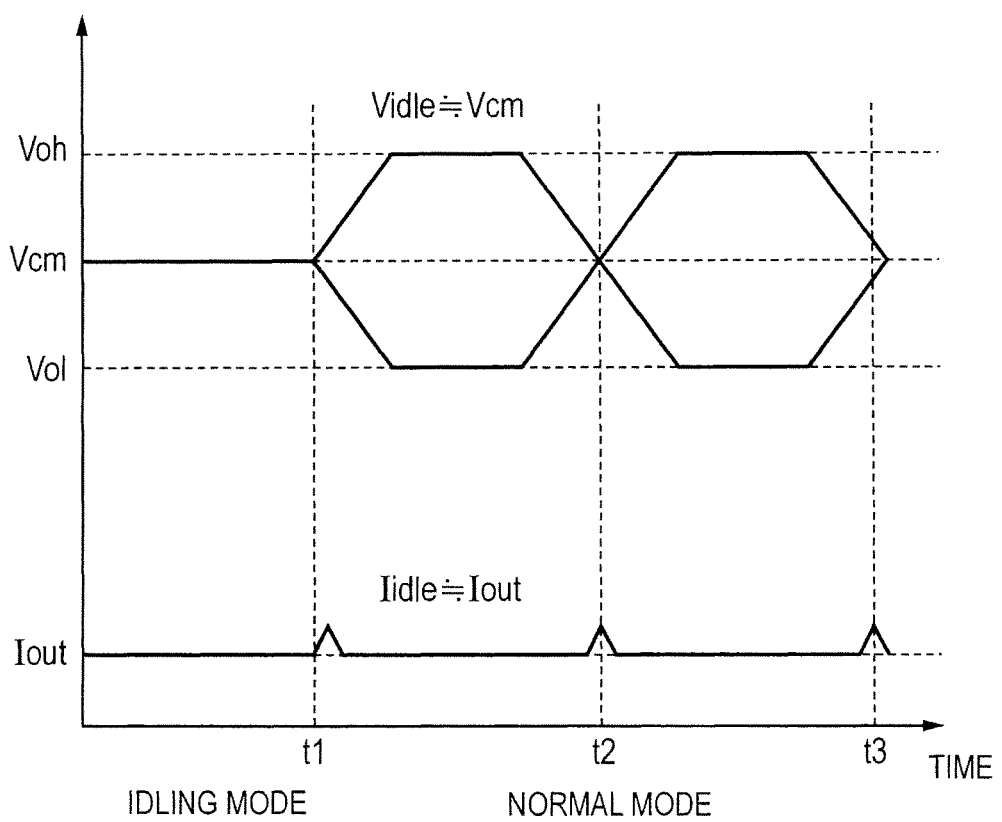
FIG. 12 is a drawing illustrating signal wave forms outputted from the output terminals PADP and PADN in the present embodiment.

FIG. 12 illustrates signal wave forms outputted from the output terminals PADP and PADN in the present embodiment. In FIG. 12, a period before time t1 is the idling mode and a period after time t1 is the normal mode. At time t2 and t3, the logic of the output signals is reversed.

As illustrated in FIG. 12, the idling voltage Vidle in the idling mode becomes nearly equal to the common voltage Vcm in the normal mode, by adjusting the current amount which flows through the termination resistors RP and RN in the idling mode. The constant current Iidle which flows through the transistor NTC in the idling mode becomes nearly equal to the constant current Iout which flows through the transistor NTC in the normal mode. As a result, it becomes possible to keep the variation range of the common voltage in the idling mode and in the normal mode within the range specified by the standard of high-speed serial communications.

Effect of Embodiment 1

As described above, according to the semiconductor device 1 according to Embodiment 1, the amount of current which flows through the drive circuit 20 in the idling mode is adjusted so as to become substantially equal to the current which flows through the drive circuit 20 in the normal mode. As a result, it is possible to suppress a variation of the common voltage in the idling mode and in the normal mode.

It is further possible to improve the quality of the differential serial signals outputted from the output circuit 10 by suppressing the variation of the common voltage. The common voltage can be kept within the allowable variation range of the common voltage specified by the standard; accordingly it is possible to improve the mass production yield.

The amount of current which flows through the drive circuit 20 in the idling mode is decreased by the adjustment when compared with that before the adjustment; accordingly, it is possible to reduce the power consumption of the output circuit in the idling mode.

The amount of current which flows through the drive circuit 20 in the idling mode is adjusted taking the channel length modulation effect of the MOS current source into consideration; accordingly, it is not necessary to lengthen the gate length of the MOS current source in order to suppress the channel length modulation effect. As a result, it is possible to make smaller the area of the output circuit.

A Modified Example of Embodiment 1

<<An Entire Configuration of an Output Circuit 10A>>

Figure 13:
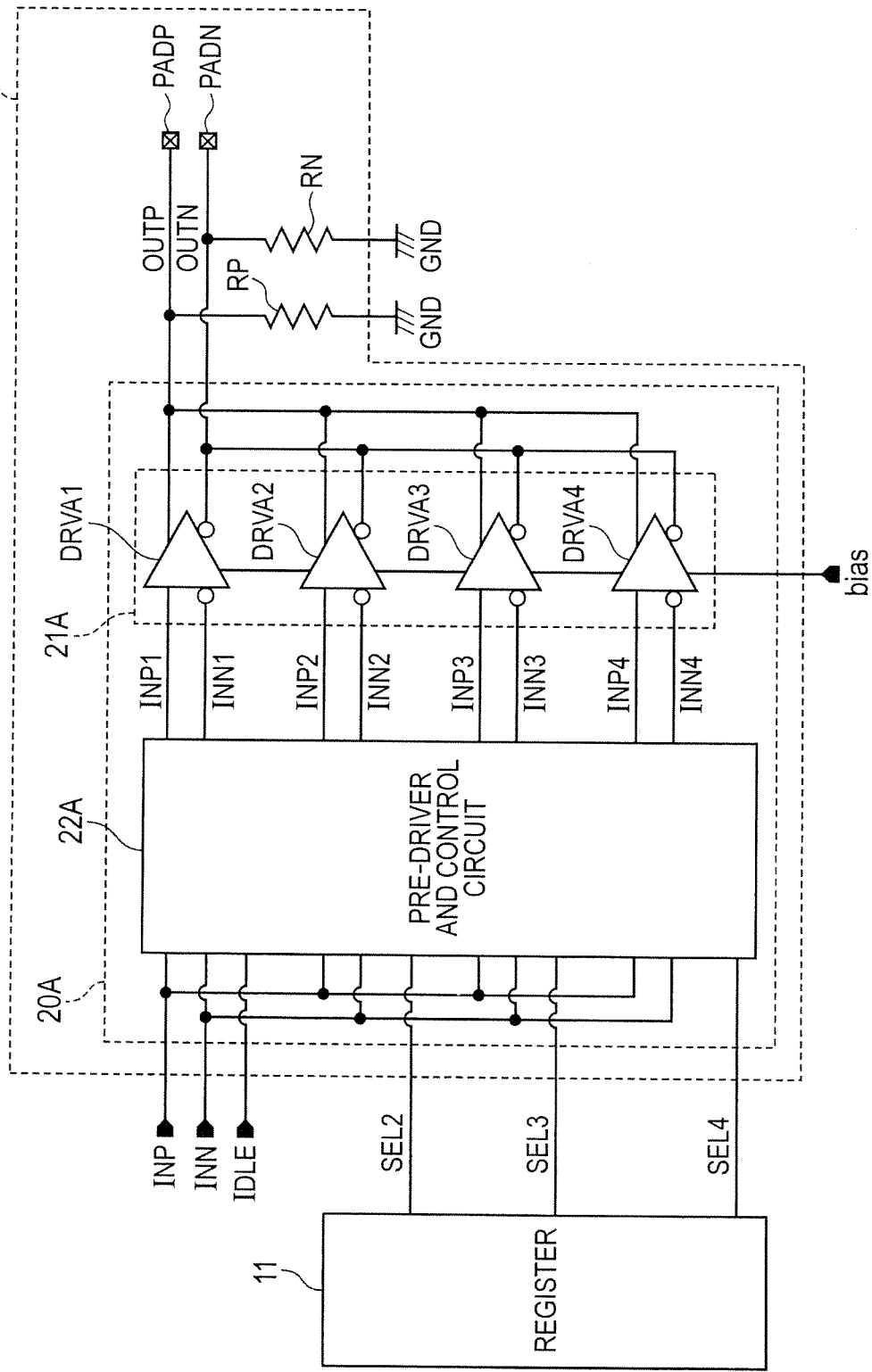
FIG. 13 is a block diagram illustrating a configuration of an output circuit 10A according to a modified example of Embodiment 1.

FIG. 13 is a block diagram illustrating a configuration of an output circuit 10A according to a modified example of Embodiment 1. The modified example of Embodiment 1 differs from Embodiment 1 in the points that the transistor which composes each driver is changed from an NMOS transistor to a PMOS transistor, and that the termination resistors RP and RN are provided between the output terminals PADP and PADN and the ground node GND, respectively. Hereinafter, the different points from Embodiment 1 are mainly explained.

As illustrated in FIG. 13, the output circuit 10A includes output terminals PADP and PADN, a termination resistor RP on the positive phase side, a termination resistor RN on the negative phase side, and a drive circuit 20A.

The termination resistor RP on the positive phase side is coupled between the ground node GND and the output terminal PADP on the positive phase side. The termination resistor RN on the negative phase side is coupled between the ground node GND and the output terminal PADN on the negative phase side.

The drive circuit 20A flows a constant current through one of the termination resistors RP and RN between the power node VCC and the ground node in the normal mode, corresponding to inputted differential serial signals INP and INN. The drive circuit 20A flows a constant current through both of the termination resistors RP and RN in the idling mode.

In further detail, the drive circuit 20A includes a pre-driver and control circuit 22A and plural drivers (four drivers in the case of FIG. 13) DRVA1-DRVA4 coupled in parallel with each other. In the normal mode, each driver DRVAi (i=1-4) generates small-amplitude differential serial signals OUTP and OUTN from the corresponding differential signals INPi and INNi received from the pre-driver and control circuit 22A, and outputs the generated small-amplitude differential serial signals OUTP and OUTN from the output terminals PADP and PADN. As is the case with Embodiment 1, the drive capability of each driver is different. With reference to the drive capability of the driver DRVA4, the drive capability of the drivers DRVA2 and DRVA3 is two times, and the drive capability of the driver DRVA1 is five times.

<<A Configuration of Each of the Drivers DRVA1-DRVA4>>

Figure 14:
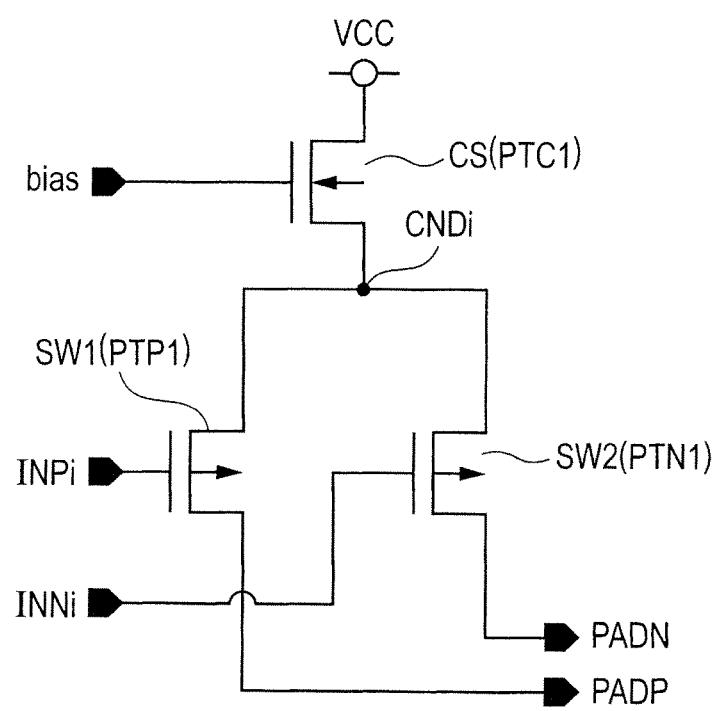
FIG. 14 is a circuit diagram illustrating a configuration of the driver DRVA4 illustrated in FIG. 13.

FIG. 14 is a circuit diagram illustrating a configuration of the driver DRVA4 illustrated in FIG. 13. As illustrated in FIG. 14, the driver DRVA4 (i=4 in FIG. 14) includes a constant current source CS, a first switch SW1, and a second switch SW2.

In the case of FIG. 14, the constant current source CS is comprised of a PMOS transistor PTC1 of which a gate is supplied with a predetermined bias voltage bias. A source of the transistor PTC1 is coupled to the power node VCC.

In the case of FIG. 14, the first switch SW1 is formed by a PMOS transistor PTP1. A source of the transistor PTP1 is coupled to a drain of the transistor PTC1 (a connection node CNDi), and a drain of the transistor PTP1 is coupled to the output terminal PADP on the positive phase side. A corresponding input signal INPi (i=4 in the present case) is inputted to a gate of the transistor PTP1, from the pre-driver and control circuit 22A.

In the case of FIG. 14, the second switch SW2 is formed by a PMOS transistor PTN1. A source of the transistor PTN1 is coupled to a drain of the transistor PTC1 (a connection node CNDi), and a drain of the transistor PTN1 is coupled to the output terminal PADN on the negative phase side. A corresponding input signal INNi (i=4 in the present case) is inputted to the gate of the transistor NTP1, from the pre-driver and control circuit 22A.

Figure 15:
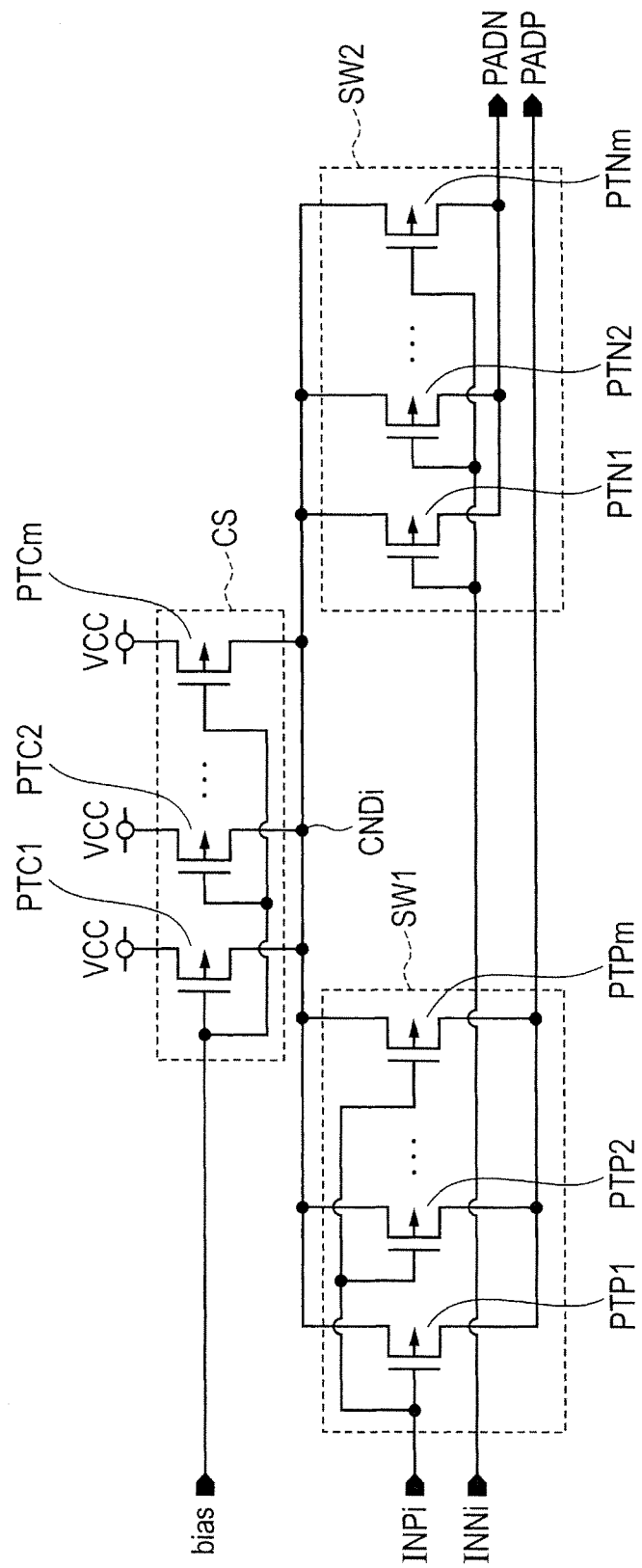
FIG. 15 is a circuit diagram illustrating a configuration of the drivers DRVA1-DRVA3 illustrated in FIG. 13.

FIG. 15 is a circuit diagram illustrating a configuration of the drivers DRVA1-DRVA3 illustrated in FIG. 13. As illustrated in FIG. 15, the driver DRVAi (i=1-3 in FIG. 15) includes a constant current source CS, a first switch SW1, and a second switch SW2.

The constant current source CS is comprised of m-piece PMOS transistors PTC1-PTCm (m is 2 or a greater integer) coupled in parallel, to gates of which a predetermined bias voltage bias is applied. As for the driver DRVA1, m=5 and as for the drivers DRVA2 and DRVA3, m=2. A source of each of the transistors PTC1-PTCm is coupled to the power node VCC. A drain of each of the transistors PTC1-PTCm is coupled to the connection node CNDi in common (a connection node CND1 is provided to the driver DRVA1, a connection node CND2 is provided to the driver DRVA2, and a connection node CND3 is provided to the driver DRVA3).

The first switch SW1 is formed by m-piece PMOS transistors PTP1-PTPm coupled in parallel. As for the driver DRVA1, m=5 and as for the drivers DRVA2 and DRVA3, m=2. A source of each of the transistors PTP1-PTPm is coupled to the connection node CNDi, and a drain of each of the transistors PTP1-PTPm is coupled to the output terminal PADP on the positive phase side. A corresponding input signal INPi (i=1-3 in the present case) is inputted to a gate of each of the transistors PTP1-PTPm from the pre-driver and control circuit 22A (an input signal INP1 is inputted to the driver DRVA1, an input signal INP2 is inputted to the driver DRVA2, and an input signal INP3 is inputted to the driver DRVA3).

The second switch SW2 is formed by m-piece PMOS transistors PTN1-PTNm coupled in parallel. As for the driver DRVA1, m=5 and as for the drivers DRVA2 and DRVA3, m=2. A source of each of the transistors PTN1-PTNm is coupled to the connection node CNDi, and a drain of each of the transistor PTN1-PTNm is coupled to the output terminal PADN on the negative phase side. A corresponding input signal INNi (i=1-3 in the present case) is inputted to a gate of each of the transistors PTN1-PTNm from the pre-driver and control circuit 22A (an input signal INN1 is inputted to the driver DRVA1, an input signal INN2 is inputted to the driver DRVA2, and an input signal INN3 is inputted to the driver DRVA3).

The transistors PTP1-PTPm, PTN1-PTNm, and PTC1-PTCm illustrated in FIG. 14 and FIG. 15 are substantially equal in size and property with each other. Therefore, the drive capability is determined by the number of the transistors coupled in parallel. It is also possible to adjust the drive capability by means of gate width, instead of the number of transistors.

<<The Operation of the Pre-Driver and Control Circuit 22A<<

FIG. 16 is a drawing for explaining operation of the pre-driver and control circuit 22A illustrated in FIG. 13. In FIG. 16, a logical level at a low level (L level) is expressed by "0", and a logical level at a high level (H level) is expressed by "1."

With reference to FIG. 13-FIG. 16, operation in the normal mode (when the idling signal IDLE is "0") is explained first. In this case, a negative phase input signal INN is inputted as corresponding signals INP1-INP4 to the gate of each transistor which forms the first switch SW1 provided in the drivers DRV1-DRV4. A positive phase input signal INP is inputted as the corresponding signals INN1-INN4 to the gate of each transistor which forms the second switch SW2 provided in the drivers DRV1-DRV4. The signal inputted to each of the drivers DRV1-DRV4 does not depend on the signal level of the selection signals SEL2-SEL4 held in the register 11.

Therefore, when a positive phase input signal INP is H level and a negative phase input signal INN is L level, the first switch SW1 becomes in a conductive state, and the second switch SW2 becomes in a non-conductive state. As a result, a positive phase signal OUTP outputted from the output terminal PADP is set to H level, and a negative phase signal OUTN outputted from the output terminal PADN is set to L level. When the positive phase input signal INP is L level and the negative phase input signal INN is H level, the first switch SW1 becomes in a non-conductive state, and the second switch SW2 becomes in a conductive state. As a result, the positive phase signal OUTP outputted from the output terminal PADP is set to L level, and the negative phase signal OUTN outputted from the output terminal PADN is set to H level.

Next, operation in the idling mode (when the idling signal IDLE is "1") is explained. In this case, a signal of L level ("0") is inputted as the input signal INP1 to the gate of each transistor which forms the first switch SW1 provided in the driver DRVA1. A signal of L level ("0") is inputted as the input signal INN1 to the gate of each transistor which forms the second switch SW2 provided in the driver DRVA1. The signals INP1 and INN1 inputted to the driver DRVA1 do not depend on the setting value of the register 11. As a result, both of the first switch SW1 and the second switch SW2, provided in the driver DRVA1, become in a conductive state.

The signals inputted to the drivers DRVA2-DRVA4 differ respectively, according to the value of the selection signals SEL2-SEL4 supplied from the register 11. In a specific driver DRVAi (i=2-4) corresponding to the selection signal SELi of H level ("1"), a signal of H level ("1") is inputted as the input signal INPi to each transistor which forms the first switch SW1, and a signal of H level ("1") is inputted as the input signal INNi to each transistor which forms the second switch SW2. As a result, both of the first switch SW1 and the second switch SW2, provided in the specific driver DRVAi (i=2-4) corresponding to the selection signal SELi of H level, become in a non-conductive state.

In a specific driver DRVAi (i=2-4) corresponding to the selection signal SELi of L level ("0"), on the other hand, a signal of L level ("0") is inputted as the input signal INPi to each transistor which forms the first switch SW1, and a signal of L level ("0") is inputted as the input signal INNi to each transistor which forms the second switch SW2. As a result, both of the first switch SW1 and the second switch SW2, provided in the specific driver DRVAi (i=2-4) corresponding to the selection signal SELi of L level, become in a conductive state.

The setting value of the register 11, that is, whether the selection signals SEL2-SEL4 are set to H level "1" or not, is determined according to the magnitude of the idling voltage outputted in the idling mode. When the selection signals SEL2-SEL4 are all set to L level ("0") and a constant current is supplied to the termination resistors RP and RN from all the drivers DRVA1-DRVA4 in the idling mode, the idling voltage may become higher than the common voltage in the normal mode. In this case, it is set such that the current is not flowed through the termination resistors RP and RN from a part of (one or more) specific drivers, and that the current is flowed through termination resistors RP and RN from the remaining one or more drivers. Accordingly, it is set such that the current which flows through the termination resistors RP and RN is reduced, and that the idling voltage becomes substantially equal to the common voltage in the normal mode.

<<A Configuration Example of the Pre-Driver and Control Circuit 22A<<

Figure 17A:
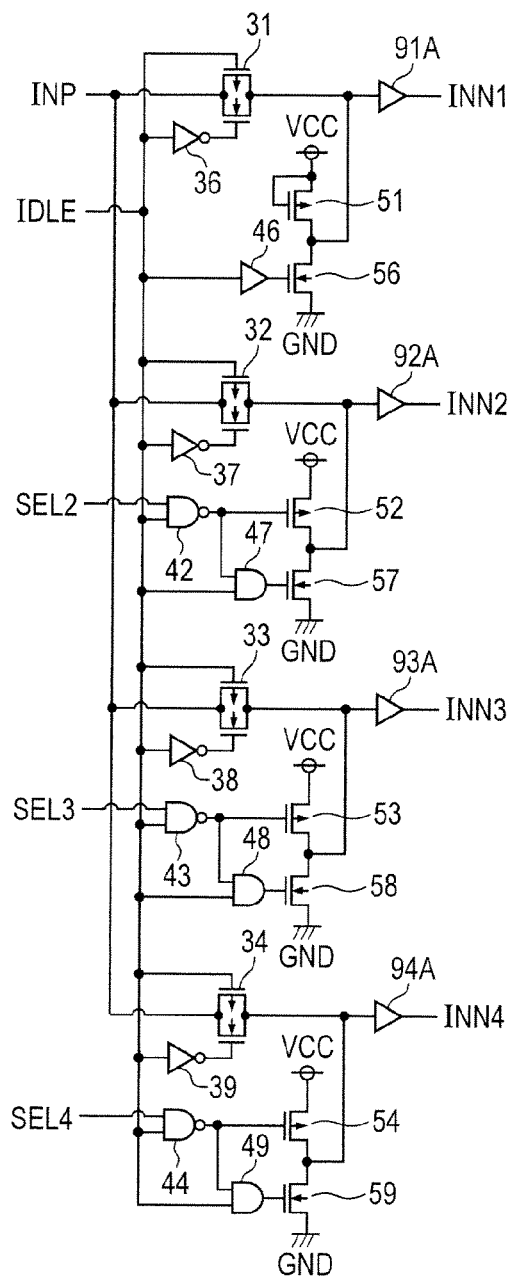
FIG. 17A and FIG. 17B are circuit diagrams illustrating a configuration example of the pre-driver and control circuit 22A illustrated in FIG. 13.
Figure 17B:
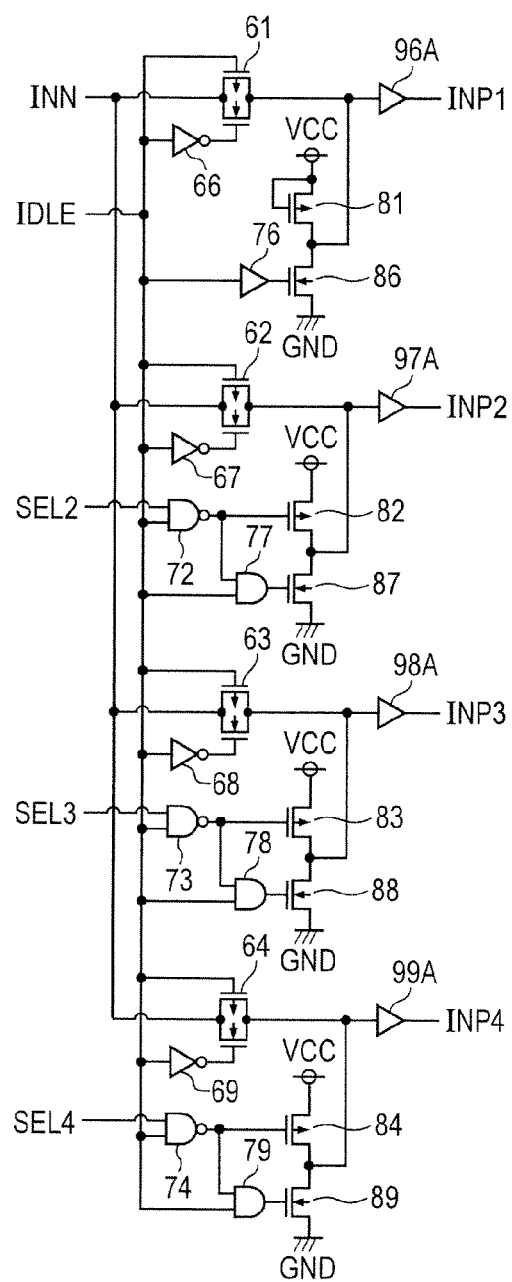

FIG. 17A and FIG. 17B are circuit diagrams illustrating a configuration example of the pre-driver and control circuit 22A illustrated in FIG. 13. FIG. 17A illustrates a circuit part which receives the positive phase input signal INP and generates the signals INN1-INN4 to be outputted to the second switch SW2 included in each of the drivers DRVA1-DRVA4, respectively. FIG. 17B illustrates a circuit part which receives the negative phase input signal INN and generates the signals INP1-INP4 to be outputted to the first switch SW1 included in each of the drivers DRVA1-DRVA4, respectively.

As illustrated in FIGS. 17A and 17 (B), the pre-driver and control circuit 22A differs from the pre-driver and control circuit 22 illustrated in FIGS. 6A and 6 (B) in that buffers 91A-94A, and 96A-99A are included in lieu of the inverters 91-94 and 96-99. From the buffers 91A-94A, the input signals INN1-INN4 are fed to the second switch SW2 of the drivers DRVA1-DRVA4, respectively. From the buffers 96A-99A, the input signals INP1-INP4 are fed to the first switch SW1 of the drivers DRVA1-DRVA4, respectively. FIGS. 17 (A) and 17 (B) are the same as FIGS. 6 (A) and 6 (B) in the other points; accordingly, the same reference symbol will be attached to the same or corresponding part, and the explanation thereof will not be repeated.

Effect of the Modified Example 1 of Embodiment 1

The output circuit 10A having the configuration described above also brings about the same effect as is the case with the output circuit 10 illustrated in Embodiment 1.

Embodiment 2

In Embodiment 1, the amount of current which flows through the termination resistors RP and RN is adjusted, by setting the switches SW1 and SW2 included in a specific part of the drivers to a non-conductive state, in the idling mode. In Embodiment 2, the constant current source of a specific part of the drivers is set to a non-operating state, by cutting off a bias voltage supplied to the constant current source of the specific part of drivers, consequently, the amount of current which flows through the termination resistors RP and RN is adjusted in the idling mode. Hereinafter, the explanation thereof is made concretely.

<<A Configuration of the Output Circuit 110>>

Figure 18:
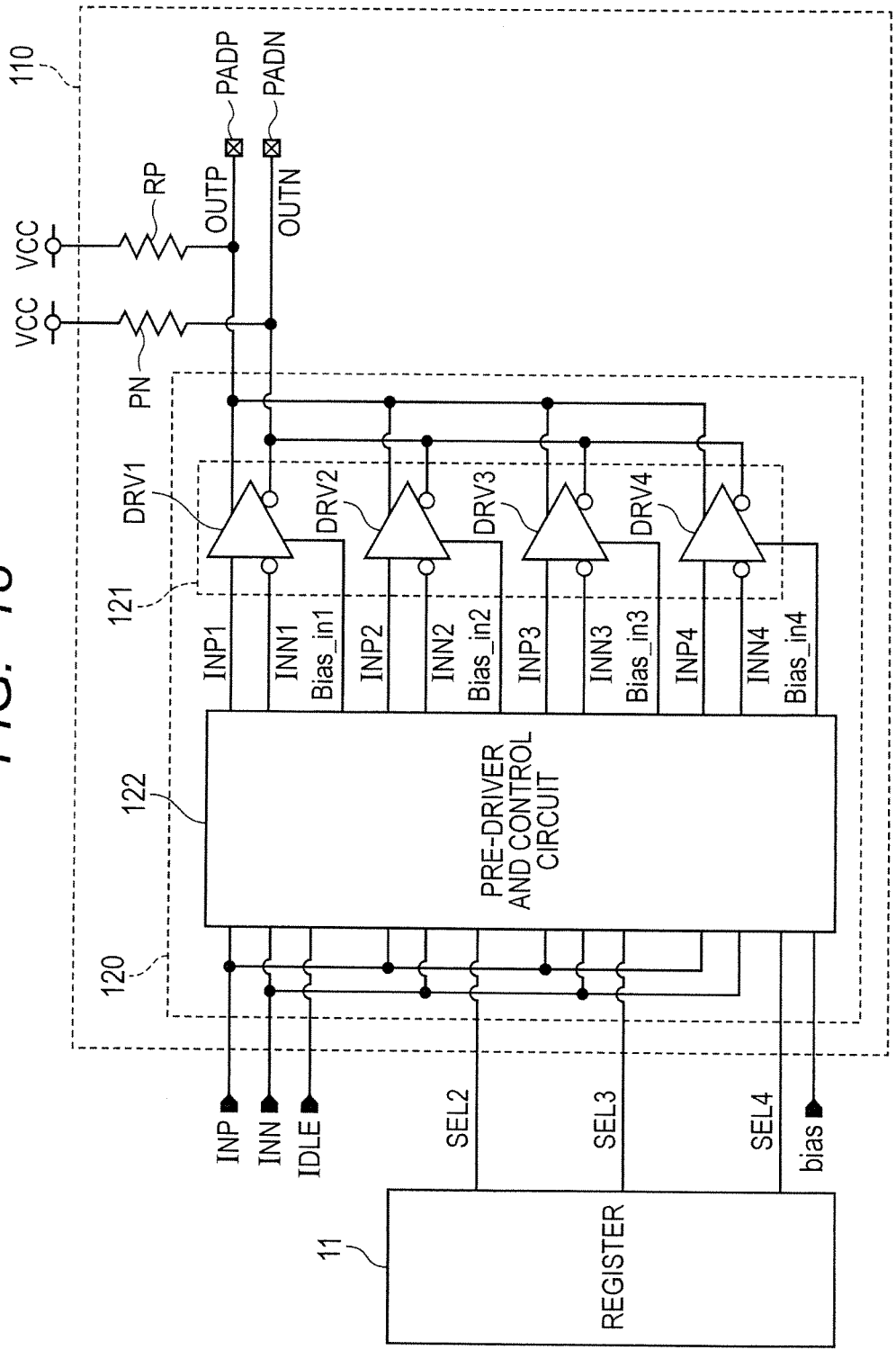
FIG. 18 is a block diagram illustrating a specific configuration of an output circuit 110 according to Embodiment 2.

FIG. 18 is a block diagram illustrating a specific configuration of an output circuit 110 according to Embodiment 2. As illustrated in FIG. 18, the output circuit 110 includes output terminals PADP and PADN, a termination resistor RP on the positive phase side, a termination resistor RN on the negative phase side, and a drive circuit 120.

The termination resistor RP on the positive phase side is coupled between the power node VCC and the output terminal PADP on the positive phase side. The termination resistor RN on the negative phase side is coupled between the power node VCC and the output terminal PADN on the negative phase side.

The drive circuit 120 flows a constant current through one of the termination resistors RP and RN between the power node VCC and the ground node GND in the normal mode, corresponding to inputted differential serial signals INP and INN. Accordingly, the output circuit 110 outputs small-amplitude differential serial signals OUTP and OUTN corresponding to the inputted differential serial signals INP and INN, from the output terminals PADP and PADN. In the idling mode, the drive circuit 120 flows a constant current through both termination resistors RP and RN. Accordingly, the output circuit 110 outputs an idling voltage from the output terminals PADP and PADN.

In further detail, the drive circuit 120 includes a pre-driver and control circuit 122 and plural drivers (four drivers in the case of FIG. 18) DRV1-DRV4 coupled in parallel with each other. In the normal mode, each driver DRVi (i=1-4) generates small-amplitude differential serial signals OUTP and OUTN from the corresponding differential signals INPi and INNi received from the pre-driver and control circuit 122, and outputs the generated small-amplitude differential serial signals OUTP and OUTN from the output terminals PADP and PADN.

The configuration of the drivers DRV1-DRV4 is the same as that of the counterparts explained in FIGS. 3 and 4; therefore, the detailed explanation thereof is not repeated. It should be noted, however, that the constant current sources included in the drivers DRV1-DRV4 illustrated in FIG. 18 are supplied with control voltages Bias_in1-Bias_in4, respectively, from the pre-driver and control circuit 122.

<<Operation of the Pre-Driver and Control Circuit 122>>

The pre-driver and control circuit 122 illustrated in FIG. 18 receives the idling signal IDLE from the logic circuit unit 12 (the physical layer circuit 12D) illustrated in FIG. 1, and the differential serial signals INP and INN from the parallel-serial conversion circuit 13. The pre-driver and control circuit 122 further receives selection signals SEL2-SEL4 corresponding to the value of the register 11 set up in advance. The selection signals SEL2-SEL4 correspond to the drivers DRV2-DRV4, respectively. In response to these signals, the pre-driver and control circuit 122 outputs signals (INP1, INN1)-(INP4, INN4) to the drivers DRV1-DRV4, respectively. In response to these signals, the pre-driver and control circuit 122 further outputs control voltages Bias_in1-Bias_in4 to the constant current source included in the drivers DRV1-DRV4, respectively.

FIG. 19 is a drawing for explaining operation of the pre-driver and control circuit 122 illustrated in FIG. 18. In FIG. 19, a logical level at a low level (L level) is expressed by "0", and a logical level at a high level (H level) is expressed by "1."

With reference to FIGS. 18 and 19, operation in the normal mode (when the idling signal IDLE is "0") is explained first. In this case, a signal /INP, obtained by inverting the inputted positive phase signal INP, is inputted as the corresponding signals INP1-INP4 to the gate of each transistor which forms the first switch SW1 provided in the drivers DRV1-DRV4. A signal /INN, obtained by inverting the inputted negative phase signal INN, is inputted as the corresponding signals INN1-INN4 to the gate of each transistor which forms the second switch SW2 provided in the drivers DRV1-DRV4. A bias voltage bias is inputted as the control voltages Bias_in1-Bias_in4 to the gate of each transistor which composes the constant current source CS provided in the drivers DRV1-DRV4. The signal inputted to each of the drivers DRV1-DRV4 does not depend on the signal level of the selection signals SEL2-SEL4 held in the register 11. As a result, the small-amplitude differential serial signals OUTP and OUTN corresponding to the input signals INP and INN are outputted from the output terminals PADP and PADN.

Next, operation in the idling mode (when the idling signal IDLE is "1") is explained. In this case, a signal of H level ("1") is inputted as the input signals INP1-INP4 to the gate of each transistor which forms the first switch SW1 provided in the drivers DRV1-DRV4, respectively. A signal of H level ("1") is inputted as the input signals INN1-INN4 to the gate of each transistor which forms the second switch SW2 provided in the drivers DRV1-DRV4, respectively. The signal inputted to each of the drivers DRV1-DRV4 does not depend on the signal level of the selection signals SEL2-SEL4 held in the register 11. As a result, both of the first SW1 and the second switch SW2, provided in each of the drivers DRV1-DRV4, become in a conductive state.

The bias voltage bias is inputted as the control voltage Bias_in1 to the gate of each transistor which composes the constant current source CS provided in the driver DRV1. The control voltage Bias_in1 does not depend on the setting value of the register 11. As a result, the constant current source provided in the driver DRV1 becomes in an operating state.

On the other hand, the control voltages Bias_in2-Bias_in4 inputted respectively to the drivers DRV2-DRV4 are different, depending on the value of the selection signals SEL2-SEL4 supplied from the register 11, respectively. In a specific driver DRVi (i=2-4) corresponding to the selection signal SELi of H level ("1"), the ground voltage (zero voltage) is inputted as the control voltage Bias_ini (i=2-4) to the gate of each transistor which composes the constant current source CS. As a result, the constant current source CS provided in the specific driver DRVi (i=2-4) corresponding to the selection signal SELi of H level becomes in a non-operating state.

On the other hand, in the driver DRVi (i=2-4) corresponding to the selection signal SELi of L level ("0"), the bias voltage bias is inputted as the control voltage Bias_ini (i=2-4) to the gate of each transistor which composes the constant current source CS. As a result, the constant current source CS provided in the driver DRVi (i=2-4) corresponding to the selection signal SELi of L level becomes in an operating state.

<<A Configuration Example of the Pre-Driver and Control Circuit 122>>

Figure 20A:
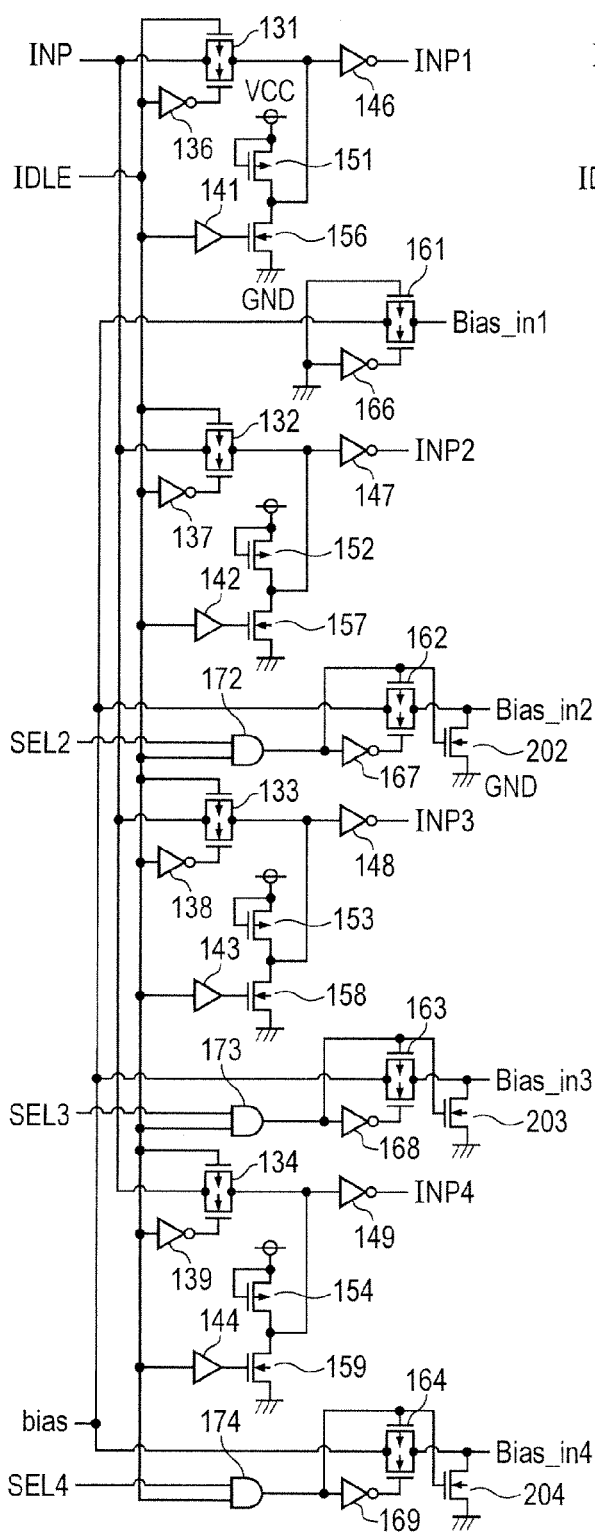
FIG. 20A and FIG. 20B are circuit diagrams illustrating a configuration example of the pre-driver and control circuit 122 illustrated in FIG. 18.
Figure 20B:
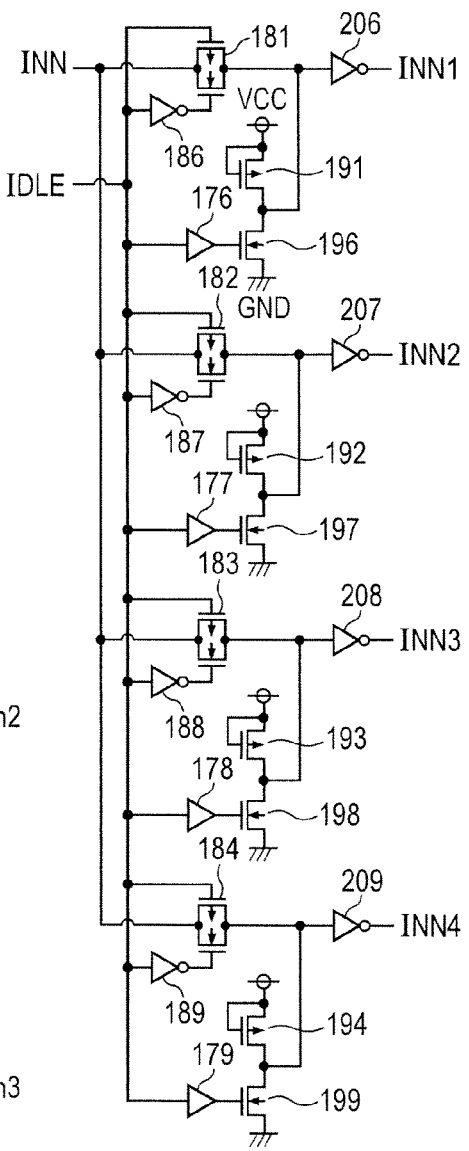

FIG. 20A and FIG. 20B are circuit diagrams illustrating a configuration example of the pre-driver and control circuit 122 illustrated in FIG. 18. FIG. 20A illustrates a circuit part which receives the positive phase input signal INP and generates the signals INP1-INP4 to be outputted to the first switch SW1 included in each of the drivers DRV1-DRV4, respectively. FIG. 20B illustrates a circuit part which receives the negative phase input signal INN and generates the signals INN1-INN4 to be outputted to the second switch SW2 included in each of the drivers DRV1-DRV4, respectively.

As illustrated in FIG. 20A, the pre-driver and control circuit 122 includes transmission gates 131-134 and 161-164, inverters 136-139, 146-149, and 166-169, buffers 141-144, AND gates 172-174, PMOS transistors 151-154, and NMOS transistors 156-159 and 202-204.

The inputted positive phase signal INP is fed to the inverters 146-149 respectively via the transmission gates 131-134. The idling signal IDLE is fed to a gate of the PMOS transistor which forms transmission gates 131-134. A signal obtained by inverting the idling signal IDLE with the inverters 136-139 is respectively inputted to a gate of an NMOS transistor which forms the transmission gates 131-134.

The PMOS transistor 151 and the NMOS transistor 156 are coupled between the power node VCC and the ground node GND in this order, and a connection node of these transistors 151 and 156 is coupled to an input node of the inverter 146. A gate of the transistor 151 is coupled to the power node VCC. Therefore, the transistor 151 is always in OFF state. The idling signal IDLE is inputted to a gate of the transistor 156 via the buffer 141.

The PMOS transistor 152 and the NMOS transistor 157 are coupled between the power node VCC and the ground node GND in this order, and a connection node of these transistors 152 and 157 is coupled to an input node of the inverter 147. A gate of the transistor 152 is coupled to the power node VCC. Therefore, the transistor 152 is always in OFF state. The idling signal IDLE is inputted to a gate of the transistor 157 via the buffer 142.

The PMOS transistor 153 and the NMOS transistor 158 are coupled between the power node VCC and the ground node GND in this order, and a connection node of these transistors 153 and 158 is coupled to an input node of the inverter 148. A gate of the transistor 153 is coupled to the power node VCC.

Therefore, the transistor 153 is always in OFF state. The idling signal IDLE is inputted to a gate of the transistor 158 via the buffer 143.

The PMOS transistor 154 and the NMOS transistor 159 are coupled between the power node VCC and the ground node GND in this order, and a connection node of these transistors 154 and 159 is coupled to an input node of the inverter 149. A gate of the transistor 154 is coupled to the power node VCC. Therefore, the transistor 154 is always in OFF state. The idling signal IDLE is inputted to a gate of the transistor 159 via the buffer 144.

The signals INP1-INP4 are outputted from the inverters 146-149 to the corresponding drivers DRV1-DRV4, respectively.

The inputted bias voltage bias is outputted as a control voltage Bias_in1 via the transmission gate 161. A gate of the PMOS transistor which forms the transmission gate 161 is coupled to the ground node GND, and a gate of the NMOS transistor which forms the transmission gate 161 is coupled to the ground node via the inverter 166. Therefore, the transmission gate 161 is always in a conductive state.

The inputted bias voltage bias is outputted as a control voltage Bias_in2 via the transmission gate 162. The NMOS transistor 202 is coupled between the output node of the transmission gate 162 and the ground node GND. The AND gate 172 outputs the AND operation result of the idling signal IDLE and the selection signal SEL2 to a gate of the PMOS transistor which forms the transmission gate 162 and to a gate of the transistor 202. The output of the AND gate 172 is further fed to a gate of the NMOS transistor which forms the transmission gate 162 via the inverter 167.

The inputted bias voltage bias is outputted as a control voltage Bias_in3 via the transmission gate 163. The NMOS transistor 203 is coupled between the output node of the transmission gate 163 and the ground node GND. The AND gate 173 outputs the AND operation result of the idling signal IDLE and the selection signal SEL3 to a gate of the PMOS transistor which forms transmission gate 163 and a gate of the transistor 203. The output of the AND gate 173 is further fed to a gate of the NMOS transistor which forms the transmission gate 163 via the inverter 168.

The inputted bias voltage bias is outputted as a control voltage Bias_in4 via the transmission gate 164. The NMOS transistor 204 is coupled between the output node of the transmission gate 164 and the ground node GND. The AND gate 174 outputs the AND operation result of the idling signal IDLE and the selection signal SEL4 to a gate of the PMOS transistor which forms the transmission gate 164 and a gate of the transistor 204. The output of the AND gate 174 is further fed to a gate of the NMOS transistor which forms the transmission gate 164 via the inverter 169.

As illustrated in FIG. 20B, the pre-driver and control circuit 122 further includes transmission gates 181-184, inverters 186-189 and 206-209, buffers 176-179, PMOS transistors 191-194, and NMOS transistors 196-199.

The inputted negative phase signal INN is fed to the inverters 206-209 respectively via the transmission gates 181-184. The idling signal IDLE is fed to the gate of the PMOS transistor which forms transmission gates 181-184. A signal obtained by inverting the idling signal IDLE with the inverters 186-189 is respectively inputted to a gate of an NMOS transistor which forms the transmission gates 181-184.

The PMOS transistor 191 and the NMOS transistor 196 are coupled between the power node VCC and the ground node GND in this order, and a connection node of these transistors 191 and 196 is coupled to an input node of the inverter 206. A gate of the PMOS transistor 191 is coupled to the power node VCC. Therefore, the transistor 191 is always in OFF state. The idling signal IDLE is inputted to a gate of the NMOS transistor 196 via the buffer 176.

The PMOS transistor 192 and the NMOS transistor 197 are coupled between the power node VCC and the ground node GND in this order, and a connection node of these transistors 192 and 197 is coupled to an input node of the inverter 207. A gate of the transistor 192 is coupled to the power node VCC. Therefore, the transistor PMOS192 is always in OFF state. The idling signal IDLE is inputted to a gate of the NMOS transistor 197 via the buffer 177.

The PMOS transistor 193 and the NMOS transistor 198 are coupled between the power node VCC and the ground node GND in this order, and a connection node of these transistors 193 and 198 is coupled to an input node of inverter 208. A gate of the transistor 193 is coupled to the power node VCC. Therefore, the PMOS transistor 193 is always in OFF state. The idling signal IDLE is inputted to a gate of the NMOS transistor 198 via the buffer 178.

The PMOS transistor 194 and the NMOS transistor 199 are coupled between the power node VCC and the ground node GND in this order, and a connection node of these transistors 194 and 199 is coupled to an input node of the inverter 209. A gate of the PMOS transistor 194 is coupled to the power node VCC. Therefore, the transistor 194 is always in OFF state. The idling signal IDLE is inputted to a gate of the NMOS transistor 199 via the buffer 179.

The signals INN1-INN4 are outputted from the inverters 206-209 to the corresponding drivers DRV1 DRV4, respectively.

According to the configuration, when the idling signal IDLE is L level ("0") (in the normal mode), the transmission gates 131-134 and 181-184 are conducted. At this time, the PMOS transistors 151-154 and the NMOS transistors 156-159 are set to OFF state altogether. As a result, from the inverters 146-149, a signal /INP obtained by inverting the positive phase input signal INP is outputted, as the signals INP1-INP4 to the corresponding drivers DRV1-DRV4, respectively. From the inverters 206-209, a signal /INN obtained by inverting the negative phase input signal INN is outputted, as the signals INN1-INN4 to the corresponding drivers DRV1-DRV4, respectively.

When the idling signal IDLE is L level ("0") (in the normal mode), the transmission gates 161-164 are conducted. At this time, the NMOS transistors 202-204 are set to OFF state altogether. As a result, the bias voltage bias is outputted as the control voltages Bias_in1-Bias_in4.

Next, operation when the idling signal IDLE is H level ("1") (in the idling mode) is explained. In this case, the transmission gates 131-134 and 181-184 are in a non-conductive state. Since the NMOS transistors 156-159 and 196-199 are set to ON state, a signal of H level ("1") is outputted from the inverters 146-149 and 206-209.

When the idling signal IDLE is H level ("1") (in the idling mode), a voltage signal outputted as the control voltage Bias_in2-Bias_in4 is different depending on the selection signals SEL2-SEL4.

When the selection signal SEL2 is H level ("1"), the transmission gate 162 is in a non-conductive state and the transistor 202 is set to ON state; accordingly, a signal of L level ("0") is outputted as the control voltage Bias_in2. When the selection signal SEL2 is L level ("0"), the transmission gate 162 is in a conductive state and the NMOS transistor 202 is set to OFF state; accordingly, the bias voltage bias is outputted as the control voltage Bias_in2.

When the selection signal SEL3 is H level ("1"), the transmission gate 163 is in a non-conductive state and the transistor 203 is set to ON state; accordingly, a signal of L level ("0") is outputted as the control voltage Bias_in3. When the selection signal SEL3 is L level ("0"), the transmission gate 163 is in a conductive state and the NMOS transistor 203 is set to OFF state; accordingly, the bias voltage bias is outputted as the control voltage Bias_in3.

When the selection signal SEL4 is H level ("1"), the transmission gate 164 is in a non-conductive state and the transistor 204 is set to ON state; accordingly, a signal of L level ("0") is outputted as the control voltage Bias_in4. When the selection signal SEL4 is L level ("0"), the transmission gate 164 is in a conductive state and the NMOS transistor 204 is set to OFF state; accordingly, the bias voltage bias is outputted as the control voltage Bias_in4.

Effect of Embodiment 2

As described above, according to the semiconductor device 1 according to Embodiment 2, the amount of current which flows through the drive circuit 120 in the idling mode is adjusted so as to become substantially equal to the current which flows through the drive circuit 120 in the normal mode. As a result, it is possible to suppress a variation of the common voltage in the idling mode and in the normal mode.

It is further possible to improve the quality of the differential serial signal outputted from the output circuit 110 by suppressing the variation of the common voltage. The common voltage can be kept within the allowable variation range of the common voltage specified by the standard; accordingly it is possible to improve the mass production yield.

The amount of current which flows through the drive circuit 120 in the idling mode is decreased by the adjustment when compared with that before the adjustment; accordingly, it is possible to reduce the power consumption of the output circuit in the idling mode.

The amount of current which flows through the drive circuit 120 in the idling mode is adjusted taking the channel length modulation effect of the MOS current source into consideration; accordingly, it is not necessary to lengthen the gate length of the MOS current source in order to suppress the channel length modulation effect. As a result, it is possible to make smaller the area of the output circuit.

A Modified Example of Embodiment 2

Figure 21:
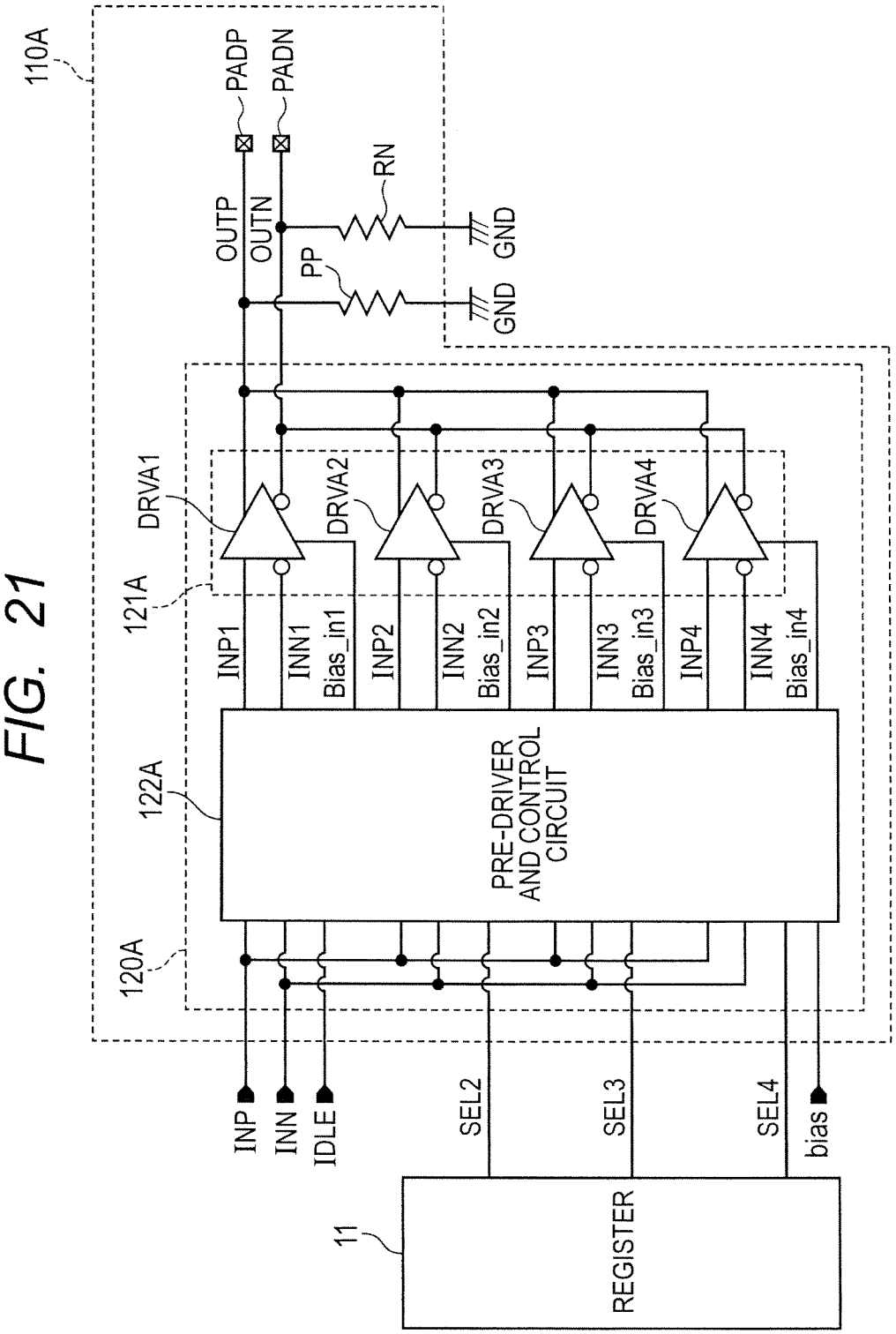
FIG. 21 is a block diagram illustrating a configuration of an output circuit 110A according to a modified example of Embodiment 2.

FIG. 21 is a block diagram illustrating a configuration of an output circuit 110A according to a modified example of Embodiment 2. The modified example of Embodiment 2 differs from Embodiment 2 in the points that the transistor which composes each driver is changed from an NMOS transistor to a PMOS transistor, and that the termination resistors RP and RN are provided between the output terminals PADP and PADN and the ground node GND, respectively. Hereinafter, the different points from Embodiment 2 are mainly explained.

As illustrated in FIG. 21, the output circuit 110A includes output terminals PADP and PADN, a termination resistor RP on the positive phase side, a termination resistor RN on the negative phase side, and a drive circuit 120A.

The termination resistor RP on the positive phase side is coupled between the ground node GND and the output terminal PADP on the positive phase side. The termination resistor RN on the negative phase side is coupled between the ground node GND and the output terminal PADN on the negative phase side.

The drive circuit 120A flows a constant current through one of the termination resistors RP and RN between the power node VCC and the ground node GND in the normal mode, corresponding to the inputted differential serial signals INP and INN. The drive circuit 120A flows a constant current through both of the termination resistors RP and RN in the idling mode.

In further detail, the drive circuit 120A includes a pre-driver and control circuit 122A and plural drivers (four drivers in the case of FIG. 21) DRVA1-DRVA4 coupled in parallel with each other. The configuration of the drivers DRVA1-DRVA4 is the same as that of the counterparts explained in FIGS. 14 and 15; therefore, the detailed explanation thereof is not repeated. It should be noted, however, that the constant current source included in the drivers DRVA1-DRVA4 illustrated in FIG. 21 are supplied with control voltages Bias_in1-Bias_in4, respectively, from the pre-driver and control circuit 122A.

<<The Operation of the Pre-Driver and Control Circuit 122A>>

FIG. 22 is a drawing for explaining operation of the pre-driver and control circuit 122A illustrated in FIG. 21. In FIG. 22, a logical level at a low level (L level) is expressed by "0", and a logical level at a high level (H level) is expressed by "1."

With reference to FIGS. 21 and 22, operation in the normal mode (when the idling signal IDLE is "0") is explained first. In this case, a negative phase input signal INN is inputted as corresponding signals INP1-INP4 to a gate of each transistor which forms the first switch SW1 provided in each of the drivers DRVA1-DRVA4. A positive phase input signal INP is inputted as the corresponding signals INN1-INN4 to a gate of each transistor which forms the second switch SW2 provided in each of the drivers DRVA1-DRVA4. A bias voltage bias is inputted as the control voltages Bias_in1-Bias_in4 to a gate of each transistor which composes the constant current source CS provided each of in the drivers DRVA1-DRVA4. The signal inputted to each of the drivers DRVA1-DRVA4 does not depend on the signal level of the selection signals SEL2-SEL4 held in the register 11. As a result, the small-amplitude differential serial signals OUTP and OUTN corresponding to the input signals INP and INN are outputted from the output terminals PADP and PADN.

Next, operation in the idling mode (when the idling signal IDLE is "1") is explained. In this case, a signal of L level ("0") is inputted as the input signals INP1-INP4 to the gate of each transistor which forms the first switch SW1 provided in each of the drivers DRVA1-DRVA4, respectively. A signal of L level ("0") is inputted as the input signals INN1-INN4 to the gate of each transistor which forms the second switch SW2 provided in each of the drivers DRVA1-DRVA4, respectively. The signal inputted to each of the drivers DRVA1-DRVA4 does not depend on the signal level of the selection signals SEL2-SEL4 held in the register 11. As a result, both of the first SW1 and the second switch SW2, provided in each of the drivers DRVA1-DRVA4, become in a conductive state.

The bias voltage bias is inputted as the control voltage Bias_in1 to the gate of each transistor which composes the constant current source CS provided in the driver DRVA1. The control voltage Bias_in1 does not depend on the setting value of the register 11. As a result, the constant current source provided in the driver DRVA1 becomes in an operating state.

On the other hand, the control voltages Bias_in2-Bias_in4 inputted respectively to the drivers DRVA2-DRVA4 are different, depending on the value of the selection signals SEL2-SEL4 supplied from the register 11, respectively. In a specific driver DRVAi (i=2-4) corresponding to the selection signal SELi of H level ("1"), the power supply voltage VCC ("1") is inputted as the control voltage Bias_ini (i=2-4) to the gate of each transistor which composes the constant current source CS. As a result, the constant current source CS provided in the specific driver DRVAi (i=2-4) corresponding to the selection signal SELi of H level becomes in a non-operating state.

On the other hand, in the driver DRVAi (i=2-4) corresponding to the selection signal SELi of L level ("0"), the bias voltage bias is inputted as the control voltage Bias_ini (i=2-4) to the gate of each transistor which composes the constant current source CS. As a result, the constant current source CS provided in the driver DRVAi (i=2-4) corresponding to the selection signal SELi of L level becomes in an operating state.

<<A Configuration Example of the Pre-Driver and Control Circuit 122A>>

FIG. 23A and FIG. 23B are circuit diagrams illustrating a configuration example of the pre-driver and control circuit 122A illustrated in FIG. 21. FIG. 23A illustrates a circuit part which receives the positive phase input signal INP and generates the signals INN1-INN4 to be outputted to the second switch SW2 included in each of the drivers DRVA1-DRVA4, respectively. FIG. 23B illustrates a circuit part which receives the negative phase input signal INN and generates the signals INP1-INP4 to be outputted to the first switch SW1 included in each of the drivers DRVA1-DRVA4, respectively.

As illustrated in FIGS. 23A and 23B, the pre-driver and control circuit 122A differs from the pre-driver and control circuit 122 illustrated in FIGS. 20A and 20B in that buffers 146A-149A and 206A-209A are included in lieu of the inverters 146-149 and 206-209. From the buffers 146A-149A, the input signals INN1-INN4 are fed to the second switch SW2 of the drivers DRVA1-DRVA4, respectively. From the buffers 206A-209A, the input signals INP1-INP4 are fed to the first switch SW1 of the drivers DRVA1-DRVA4, respectively.

The pre-driver and control circuit 122A differs further from the pre-driver and control circuit 122 illustrated in FIGS. 20A and 20B in that the PMOS transistors 202A-204A are provided in lieu of the NMOS transistors 202-204. The PMOS transistors 202A-204A are provided between the output node of the transmission gates 162-164 and the power node VCC, respectively. A signal obtained by inverting the output signal of each of the AND gates 172-174 by an inverter is inputted to a gate of each of the PMOS transistors 202A 204A, respectively.

FIGS. 23 (A) and 23 (B) are the same as FIGS. 20 (A) and 20 (B) in the other points; accordingly, the same reference symbol will be attached to the same or corresponding part, and the explanation thereof will not be repeated.

Effect of the Modified Example of Embodiment 2

The output circuit 110A having the configuration described above also brings about the same effect as is the case with the output circuit 110 illustrated in Embodiment 2.

Embodiment 3

In an output circuit 310 according to Embodiment 3, the value of resistance of termination resistors RP and RN is made variable. Specifically, the value of resistance of the termination resistors RP and RN in the idling mode is made smaller than the value of resistance of the termination resistors RP and RN in the normal mode. Accordingly, it is possible to make the idling voltage substantially equal to the common voltage in the normal mode. Hereinafter, the explanation thereof is made concretely.

<<A Configuration of the Output Circuit 310>>

Figure 24:
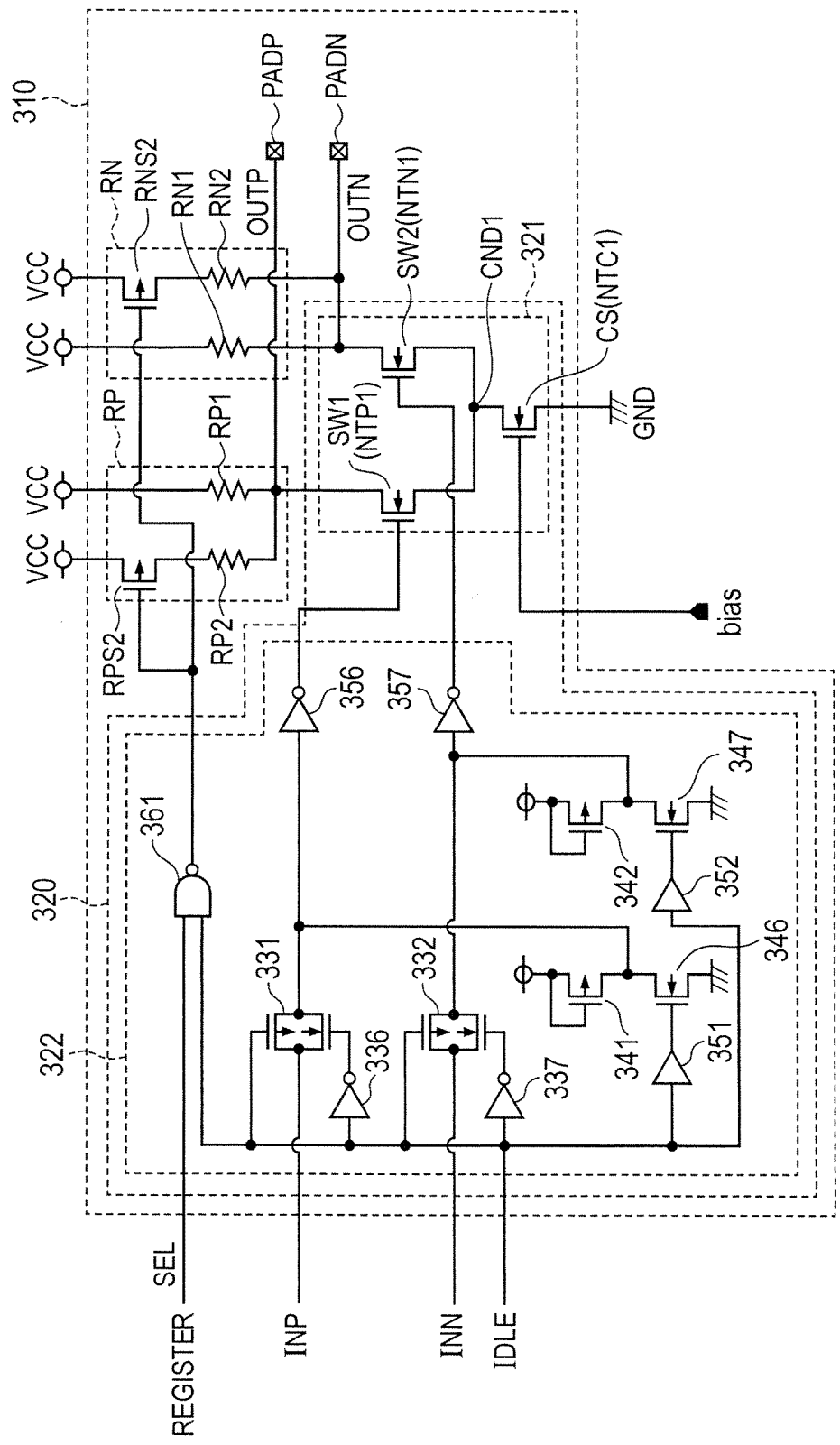
FIG. 24 is a block diagram illustrating a configuration of an output circuit 310 according to Embodiment 3.

FIG. 24 is a block diagram illustrating a configuration of the output circuit 310 according to Embodiment 3. As illustrated in FIG. 24, the output circuit 310 includes output terminals PADP and PADN, a termination resistor RP on the positive phase side, a termination resistor RN on the negative phase side, and a drive circuit 320.

The termination resistor RP on the positive phase side is coupled between the power node VCC to which a power supply voltage is applied, and the output terminal PADP on the positive phase side. The termination resistor RN on the negative phase side is coupled between the power node VCC and the output terminal PADN on the negative phase side. The value of resistance of the termination resistors RP and RN is variable.

Specifically, the termination resistor RP on the positive phase side includes resistive elements RP1 and RP2 coupled in parallel with each other between the power node VCC and the output terminal PADP, and a PMOS transistor RPS2 as a switch coupled in series with the resistive element RP2. The value of resistance is decreased by setting the transistor RPS2 to ON state in the idling mode.

Similarly, the termination resistor RN on the negative phase side includes resistive elements RN1 and RN2 coupled in parallel with each other between the power node VCC and the output terminal PADN, and a PMOS transistor RNS2 as a switch coupled in series with the resistive element RN2. The value of resistance is decreased by setting the transistor RNS2 to ON state in the idling mode.

The drive circuit 320 flows a constant current through one of the termination resistors RP and RN between the power node VCC and the ground node GND in the normal mode, corresponding to inputted differential serial signals INP and INN. Accordingly, the output circuit 310 outputs small-amplitude differential serial signals OUTP and OUTN corresponding to the inputted differential serial signals INP and INN, from the output terminals PADP and PADN. In the idling mode, the drive circuit 320 flows a constant current through both termination resistors RP and RN. Accordingly, the output circuit 310 outputs an idling voltage from the output terminals PADP and PADN.

In further detail, the drive circuit 320 includes a driver 321 and a pre-driver and control circuit 322. The driver 321 includes an NMOS transistor NTP1 serving as a switch SW1, an NMOS transistor NTN1 serving as a switch SW2, and NMOS transistor NTC1 serving as a constant current source CS. The transistor NTP1 is coupled between the output terminal PADP and a connection node CND1. The transistor NTN1 is coupled between the output terminal PADN and the connection node CND1. The transistor NTC1 is coupled between the connection node CND1 and the ground node GND. Control signals are inputted to gates of the transistors NTP1 and NTN1 from the pre-driver and control circuit 322. The bias voltage bias is applied to a gate of the transistor NTC1.

The pre-driver and control circuit 322 receives the idling signal IDLE from the logic circuit unit 12 (the physical layer circuit 12D) illustrated in FIG. 1, and the differential serial signals INP and INN from the parallel-serial conversion circuit 13. The pre-driver and control circuit 322 further receives the selection signal SEL corresponding to the value of the register 11 set up in advance. The pre-driver and control circuit 322 controls ON and OFF of the transistors NTP1, NTN1, RPS2, and RNS2 as switches, according to these signals.

Specifically, the pre-driver and control circuit 322 includes transmission gates 331 and 332, inverters 336, 337, 356, and 357, buffers 351 and 352, an NAND gate 361, PMOS transistors 341 and 342, and NMOS transistors 346 and 347.

The inputted positive phase signal INP is fed to a gate of the transistor NTP1 as the switch SW1, via the transmission gate 331 and the inverter 356 in order. The idling signal IDLE is fed to a gate of a PMOS transistor which forms the transmission gate 331. A signal obtained by inverting the idling signal IDLE by the inverter 336 is fed to a gate of an NMOS transistor which forms the transmission gate 331.

The inputted negative phase signal INN is fed to a gate of the transistor NTN1 serving as the switch SW2, via the transmission gate 332 and the inverter 357 in order. The idling signal IDLE is fed to a gate of a PMOS transistor which forms the transmission gate 332. A signal obtained by inverting the idling signal IDLE by the inverter 337 is fed to a gate of an NMOS transistor which forms the transmission gate 332.

The PMOS transistor 341 and the NMOS transistor 346 are coupled between the power node VCC and the ground node GND in this order. A connection node of these transistors 341 and 346 is coupled to an input node of the inverter 356. The transistor 341 is always set to OFF state by coupling a gate thereof to the power node VCC. The idling signal IDLE is inputted to a gate of the transistor 346 via the buffer 351.

The PMOS transistor 342 and the NMOS transistor 347 are coupled between the power node VCC and the ground node GND in this order. A connection node of these transistors 342 and 347 is coupled to an input node of the inverter 357. The transistor 342 is always set to OFF state by coupling a gate thereof to the power node VCC. The idling signal IDLE is inputted to a gate of the transistor 347 via the buffer 352.

The NAND gate 361 outputs the NAND operation result of the selection signal SEL from the register 11 and the idling signal IDLE, to gates of the transistors RPS2 and RNS2.

<<Operation of the Output Circuit 310>>

According to the configuration described above, when the idling signal IDLE is L level ("0") (in the normal mode), the transmission gates 331 and 332 are conducted and the transistors 346 and 347 are set to OFF state. Therefore, a signal /INP obtained by inverting the inputted positive phase signal INP is fed to a gate of the transistor NTP1 serving as the switch SW1. A signal /INN obtained by inverting the inputted negative phase signal INN is fed to a gate of the transistor NTN1 serving as the switch SW2. As a result, the differential signals OUTP and OUTN corresponding to the input signals INP and INN are outputted from the output terminals PADP and PADN.

When the idling signal IDLE is L level ("0") (in the normal mode), the transistors RPS2 and RNS2 are set to OFF state; accordingly, the value of resistance of the termination resistors RP and RN is decided only by the resistive elements RP1 and RN1.

Next, operation when the idling signal IDLE is H level ("1") (in the idling mode) is explained. In this case, the transmission gates 331 and 332 become in a non-conductive state, and the transistors 346 and 347 are set to ON state. Therefore, the transistor NTP1 as the switch SW1 and the transistor NTN1 as the switch SW2 are set to ON state. As a result, the idling voltage is outputted from the output terminals PADP and PADN.

On and OFF of the transistors RPS2 and RNS2 in case where the idling signal IDLE is H level ("1") (in the idling mode) are different depending on the selection signal SEL. When the selection signal SEL is H level ("1"), the transistors RPS2 and RNS2 are set to ON state. As a result, the value of resistance of the termination resistors RP and RN becomes smaller than the case in the normal mode. Conversely, when the selection signal SEL is L level ("0"), the transistors RPS2 and RNS2 are set to OFF state; accordingly, the value of resistance of the termination resistors RP and RN is the same as the case in the normal mode.

FIG. 25 illustrates a summary of the operating state of the transistors RPS2 and RNS2 employed as the terminator switches. As illustrated in FIG. 25, only when it is an idling state where the idling signal IDLE is H level ("1") and when the selection signal SEL is H level ("1"), the transistors RPS2 and RNS2 employed as the terminator switches are set to ON state.

<<Reason for Adjusting the Value of Resistance of the Termination Resistors RP and RN>>

The following explains the reason for making the value of resistance of the termination resistors RP and RN in the idling mode smaller than that in the normal mode.

Figure 26:
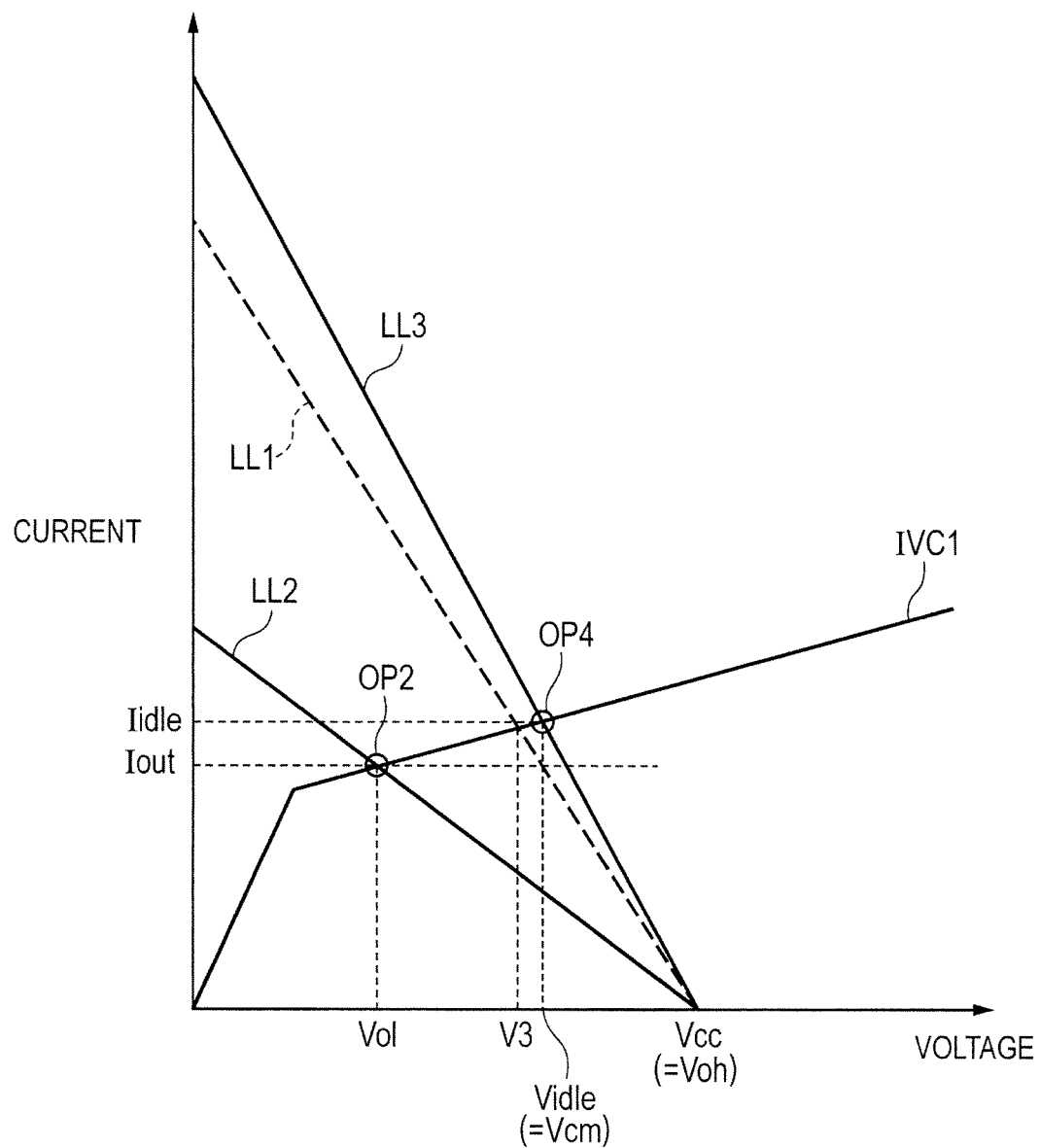
FIG. 26 is a drawing illustrating the current-voltage characteristic of a transistor NTC1 employed for a constant current source CS illustrated in FIG. 25.

FIG. 26 illustrates the current-voltage characteristic of the transistor NTC1 employed for the constant current source CS illustrated in FIG. 25.

As illustrated in FIG. 26, in the normal mode, an intersection of the load line LL2 expressed by Equation (2) described above and the current-voltage characteristic IVC1 exhibits an operating point OP2 (current Iout, voltage Vo1) of the transistor NTC1. When the selection signal SEL=0 in the idling mode, an intersection of the load line LL1 expressed by Equation (1) described above and the current-voltage characteristic IVC1 exhibits an operating point (voltage V3) of the transistor NTC1. The idling voltage V3 in the present case becomes lower than the common voltage Vcm in the normal mode.

On the other hand, when the selection signal SEL=1, the value of resistance of the termination resistors RP and RN becomes smaller; accordingly, the load line changes from LL1 to LL3. As a result, the intersection of the load line LL3 and the current-voltage characteristic IVC1 becomes an operating point OP4 (current Iidle, voltage Vidle) of the transistor NTC1; accordingly, it is possible to bring the idling voltage Vidle close to the common voltage Vcm in the normal mode.

Effect of Embodiment 3

As explained above, according to the semiconductor device according to Embodiment 3, it is possible to adjust the value of resistance of the termination resistors RP and RN in the idling mode so that the idling voltage in the idling mode becomes substantially equal to the common voltage in the normal mode. As a result, it is possible to suppress a variation of the common voltage in the idling mode and in the normal mode.

It is further possible to improve the quality of the differential serial signals outputted from the output circuit 310 by suppressing the variation of the common voltage. The common voltage can be kept within the allowable variation range of the common voltage specified by the standard; accordingly it is possible to improve the mass production yield.

The value of resistance of the termination resistors RP and RN in the idling mode is adjusted taking the channel length modulation effect of the MOS current source into consideration. Accordingly, it is not necessary to lengthen the gate length of the MOS current source in order to suppress the channel length modulation effect. As a result, it is possible to make smaller the area of the output circuit.

A Modified Example of Embodiment 3

Figure 27:
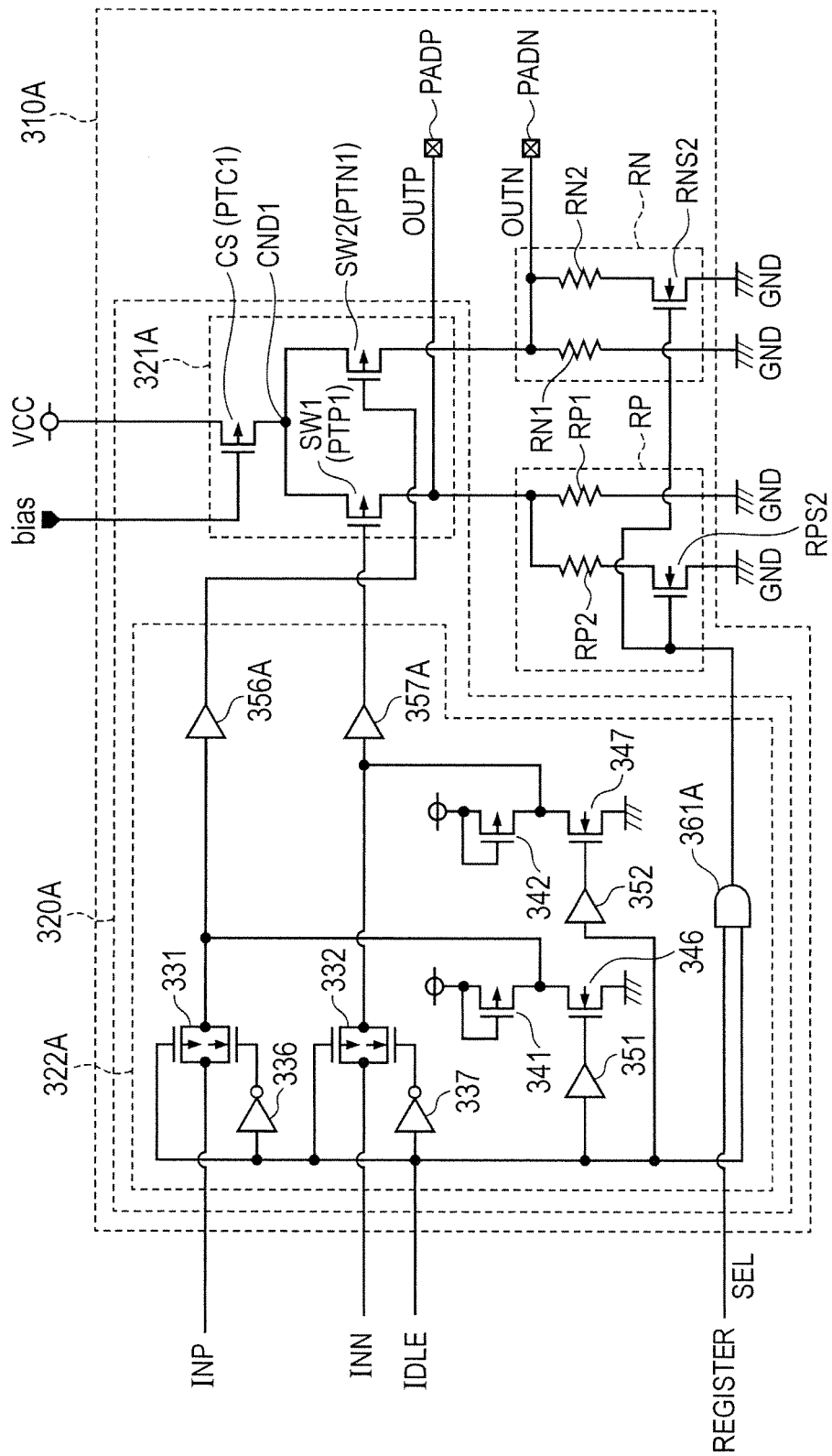
FIG. 27 is a block diagram illustrating a configuration of an output circuit 310A according to a modified example of Embodiment 3.

FIG. 27 is a block diagram illustrating a configuration of an output circuit 310A according to a modified example of Embodiment 3. The modified example of Embodiment 3 differs from Embodiment 3 in the points that the transistor which composes a driver is changed from an NMOS transistor to a PMOS transistor, and that the termination resistors RP and RN are provided between the output terminals PADP and PADN and the ground node GND, respectively. Hereinafter, the different points from Embodiment 3 are mainly explained.

As illustrated in FIG. 27, the output circuit 310A includes output terminals PADP and PADN, a termination resistor RP on the positive phase side, a termination resistor RN on the negative phase side, and a drive circuit 320A.

The termination resistor RP on the positive phase side is coupled between the ground node GND and the output terminal PADP on the positive phase side. The termination resistor RN on the negative phase side is coupled between the ground node GND and the output terminal PADN on the negative phase side. The value of resistance of the termination resistors RP and RN is variable.

Specifically, the termination resistor RP on the positive phase side includes resistive elements RP1 and RP2 coupled in parallel with each other between the ground node GND and the output terminal PADP, and an NMOS transistor RPS2 serving as a switch coupled in series with the resistive element RP2. The value of resistance is decreased by setting the transistor RPS2 to ON state in the idling mode.

Similarly, the termination resistor RN on the negative phase side includes resistive elements RN1 and RN2 coupled in parallel with each other between the ground node GND and the output terminal PADN, and an NMOS transistor RNS2 serving as a switch coupled in series with the resistive element RN2. The value of resistance is decreased by setting the transistor RNS2 to ON state in the idling mode.

The drive circuit 320A flows a constant current through one of the termination resistors RP and RN between the power node VCC and the ground node GND in the normal mode, corresponding to the inputted differential serial signals INP and INN. In the idling mode, the drive circuit 320A flows a constant current through both termination resistors RP and RN.

In further detail, the drive circuit 320A includes a driver 321A and a pre-driver and control circuit 322A. The driver 321A includes a PMOS transistor PTP1 as a switch SW1, a PMOS transistor PTN1 as a switch SW2, and a PMOS transistor PTC1 as a constant current source CS. The transistor PTP1 is coupled between the output terminal PADP and a connection node CND1. The transistor PTN1 is coupled between the output terminal PADN and the connection node CND1. The transistor PTC1 is coupled between the connection node CND1 and the power node VCC. A control signal is inputted to gates of the transistors PTP1 and PTN1 from the pre-driver and control circuit 322A. A bias voltage bias is applied to a gate of the transistor PTC1.

The detailed configuration and operation of the pre-driver and control circuit 322A are the same as those in Embodiment 3. However, the pre-driver and control circuit 322A illustrated in FIG. 27 differs from the pre-driver and control circuit 322 illustrated in FIG. 24 in that buffers 356A and 357A are included in lieu of the inverters 356 and 357. An output of the buffer 356A is fed to a gate of the transistor PTN1 as the switch SW2. An output of the buffer 357A is fed to a gate of the transistor PTP1 as the switch SW1. The pre-driver and control circuit 322A illustrated in FIG. 27 differs further from the pre-driver and control circuit 322 illustrated in FIG. 24 in that an AND gate 361A is included in lieu of the NAND gate 361. FIG. 27 is the same as FIG. 24 in the other points; accordingly, the same reference symbol will be attached to the same or corresponding part, and the explanation thereof will not be repeated.

The output circuit 310A having the configuration described above also brings about the same effect as is the case with the output circuit 310 illustrated in Embodiment 3.

Other Modified Examples of Embodiment 3

The termination resistor RP illustrated in FIG. 24 and FIG. 27 is configured with two resistive elements coupled in parallel, for the sake of simplicity. However, it is desirable to enable fine adjustment of the value of resistance of the termination resistors RP and RN in the idling mode, by coupling a larger number of resistive elements in parallel.

Specifically, each of the termination resistors RP and RN includes plural resistive elements coupled in parallel with each other, and one or more switches coupled in series to at least apart of the plural resistive elements respectively. In this case, each of the one or more switches are set to a conductive state in the normal mode, and set to a conductive state or a non-conductive state in the idling mode, according to the information held in the register 11.

As another configuration example, each of the termination resistors RP and RN include plural resistive elements coupled in series with each other, and one or more switches coupled in parallel with at least a part of the plural resistive elements respectively. In this case, each of the one or more switches are set to a non-conductive state in the normal mode, and set to a conductive state or a non-conductive in the idling mode state, according to the information held in the register 11.

Embodiment 4

An output circuit 410 according to Embodiment 4 provides parallel-coupled plural current source transistors which compose a driver, and a specific part of the current source transistors are designed so as to be set to OFF state in the idling mode. Accordingly, it is possible to adjust the amount of current which flows through the termination resistors RP and RN in the idling mode, and it is possible to make the idling voltage substantially equal to the common voltage in the normal mode. Hereinafter, the explanation thereof is made concretely.

<<A Configuration of the Output Circuit 410>>

Figure 28:
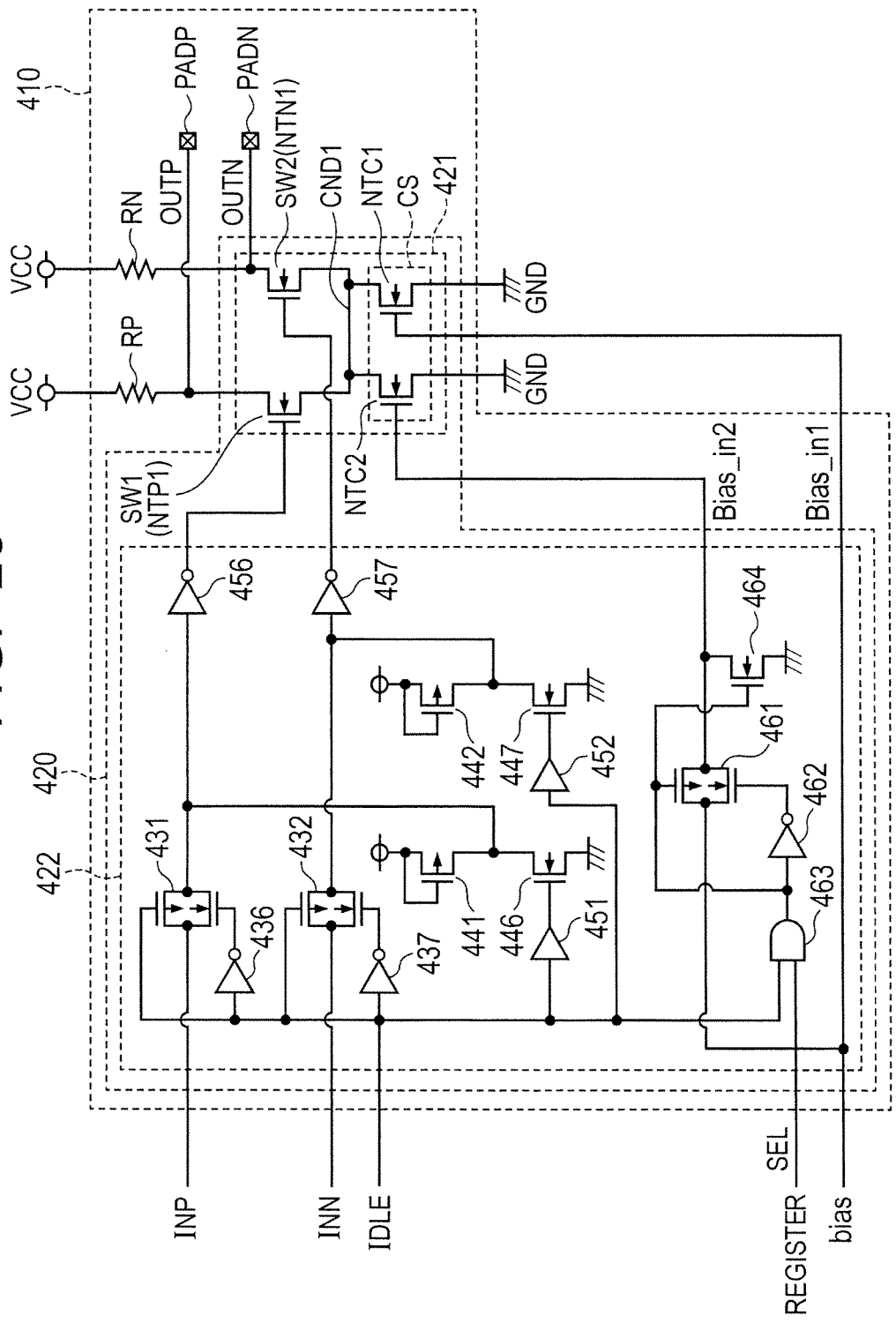
FIG. 28 is a block diagram illustrating a configuration of an output circuit 410 according to Embodiment 4.

FIG. 28 is a block diagram illustrating a configuration of an output circuit 410 according to Embodiment 4. As illustrated in FIG. 28, the output circuit 410 includes output terminals PADP and PADN, a termination resistor RP on the positive phase side, a termination resistor RN on the negative phase side, and a drive circuit 420.

The termination resistor RP on the positive phase side is coupled between a power node VCC to which a power supply voltage is applied, and the output terminal PADP on the positive phase side. The termination resistor RN on the negative phase side is coupled between the power node VCC and the output terminal PADN on the negative phase side.

The drive circuit 420 flows a constant current through one of the termination resistors RP and RN between the power node VCC and a ground node GND in the normal mode, corresponding to inputted differential serial signals INP and INN. Accordingly, the output circuit 410 outputs small-amplitude differential serial signals OUTP and OUTN, corresponding to the inputted differential serial signals INP and INN, from the output terminals PADP and PADN. In the idling mode, the drive circuit 420 flows a constant current through both termination resistors RP and RN. Accordingly, the output circuit 410 outputs an idling voltage from the output terminals PADP and PADN.

In further detail, the drive circuit 420 includes a driver 421 and a pre-driver and control circuit 422. The driver 421 includes an NMOS transistor NTP1 serving as a switch SW1, an NMOS transistor NTN1 serving as a switch SW2, and a constant current source CS. The transistor NTP1 is coupled between the output terminal PADP and a connection node CND1. The transistor NTN1 is coupled between the output terminal PADN and the connection node CND1. A control signal is inputted to gates of the transistors NTP1 and NTN1 from the pre-driver and control circuit 422.

The constant current source CS includes NMOS transistors NTC1 and NTC2 coupled in parallel with each other between the connection node CND1 and the ground node GND. Control voltages Bias_in1 and Bias_in2 are inputted to gates of the transistors NTC1 and NTC2 from the pre-driver and control circuit 422, respectively.

The pre-driver and control circuit 422 receives the idling signal IDLE from the logic circuit unit 12 (the physical layer circuit 12D) illustrated in FIG. 1, and the differential serial signals INP and INN from the parallel-serial conversion circuit 13. The pre-driver and control circuit 422 further receives a selection signal SEL corresponding to the value of the register 11 set up in advance. The pre-driver and control circuit 422 controls ON and OFF of the transistors NTP1 and NTN1 as the switches, corresponding to these signals, and supplies a control voltage to gates of the transistors NTC1 and NTC2 employed for the constant current source.

Specifically, the pre-driver and control circuit 422 includes transmission gates 431, 432, and 461, inverters 436, 437, 456, 457, and 462, buffers 451 and 452, an AND gate 463, PMOS transistors 441 and 442, and NMOS transistors 446, 447, and 464.

An inputted positive phase signal INP is fed to a gate of the transistor NTP1 as the switch SW1, via the transmission gate 431 and the inverter 456 in order. An idling signal IDLE is fed to a gate of the PMOS transistor which forms the transmission gate 431. A signal obtained by inverting the idling signal IDLE by the inverter 436 is fed to a gate of the NMOS transistor which forms the transmission gate 431.

An inputted negative phase signal INN is fed to a gate of the transistor NTN1 as the switch SW2, via the transmission gate 432 and the inverter 457 in order. An idling signal IDLE is fed to a gate of the PMOS transistor which forms the transmission gate 432. A signal obtained by inverting the idling signal IDLE by the inverter 437 is fed to a gate of the NMOS transistor which forms the transmission gate 432.

The PMOS transistor 441 and the NMOS transistor 446 are coupled between the power node VCC and the ground node GND in this order. A connection node of these transistors 441 and 446 is coupled to an input node of the inverter 456. The transistor 441 is always set to OFF state by coupling a gate thereof to the power node VCC. The idling signal IDLE is inputted to a gate of the transistor 446 via the buffer 451.

The PMOS transistor 442 and the NMOS transistor 447 are coupled between the power node VCC and the ground node GND in this order. A connection node of these transistors 442 and 447 is coupled to an input node of the inverter 457. The transistor 442 is always set to OFF state by coupling a gate thereof to the power node VCC. The idling signal IDLE is inputted to a gate of the transistor 447 via the buffer 452.

A bias voltage bias is always supplied to a gate of the transistor NTC1 for the constant current source as a control voltage Bias_in1.

The bias voltage bias is supplied to a gate of the transistor NTC2 for the constant current source via the transmission gate 461. The NMOS transistor 464 is provided between the output node of the transmission gate 461 and the ground node GND. The AND gate 463 outputs the result of the logical product of the idling signal IDLE and the selection signal SEL to a gate of the PMOS transistor which forms the transmission gate 461 and a gate of the transistor 464. The output of the AND gate 463 is fed to the gate of the NMOS transistor which forms transmission gate 461 via the inverter 462.

<<Operation of the Output Circuit 410>>

According to the configuration, when the idling signal IDLE is L level ("0") (in the normal mode), the transmission gates 431 and 432 are conducted and the transistors 446 and 447 are set to OFF state. Therefore, a signal /INP obtained by inverting the inputted positive phase signal INP is fed to the gate of the transistor NTP1 as the switch SW1. A signal /INN obtained by inverting the inputted negative phase signal INN is fed to the gate of transistor NTN1 as the switch SW2. As a result, the differential signals OUTP and OUTN corresponding to the input signals INP and INN are outputted from the output terminals PADP and PADN.

Furthermore, when the idling signal IDLE is L level ("0") (in the normal mode), the transmission gate 461 is conducted and the transistor 464 is set to OFF state. Therefore, the bias voltage bias is inputted to the gate of the transistor NTC2 for the constant current source as the control voltage Bias_in2.

Next, operation when the idling signal IDLE is H level ("1") (in the idling mode) is explained. In this case, the transmission gates 431 and 432 are in a non-conductive state, and the transistors 446 and 447 are set to ON state. Therefore, the transistor NTP1 as the switch SW1 and the transistor NTN1 as the switch SW2 are set to ON state. As a result, an idling voltage is outputted from the output terminals PADP and PADN.

When the idling signal IDLE is H level ("1") (in the idling mode), the control voltage Bias_in2 inputted to the gate of the transistor NTC2 for the constant current source is different depending on the selection signal SEL. When the selection signal SEL is H level ("1"), the transmission gate 461 is in a non-conductive state, and the transistor 464 is set to ON state. As a result, a signal of L level ("0") is inputted to the gate of the transistor NTC2 as the control voltage Bias_in2, and the transistor NTC2 is set to OFF state (non-operating state). Conversely, when the selection signal SEL is L level ("0"), the transmission gate 461 is in a conductive state, and the transistor 464 is set to OFF state. As a result, the bias voltage bias is inputted to the gate of the transistor NTC2 as the control voltage Bias_in2, and the transistor NTC2 functions as the constant current source (operating state).

FIG. 29 illustrates a summary of the operating state of the transistor NTC2 employed for current adjustment. As illustrated in FIG. 29, only when the idling signal IDLE is H level ("1"), that is in the idling state, and when the selection signal SEL is H level ("1"), the NMOS transistor NTC2 for the current adjustment is set to OFF state.

Effect of Embodiment 4

As described above, according to the semiconductor device according to Embodiment 4, the amount of current which flows through the drive circuit 420 in the idling mode is adjusted so as to become substantially equal to the current which flows through the drive circuit 420 in the normal mode. As a result, it is possible to suppress a variation of the common voltage in the idling mode and in the normal mode.

It is further possible to improve the quality of the differential serial signal outputted from the output circuit 410 by suppressing the variation of the common voltage. The common voltage can be kept within the allowable variation range of the common voltage specified by the standard; accordingly it is possible to improve the mass production yield.

The current amount which flows through the drive circuit 420 in the idling mode is decreased by the adjustment when compared with that before the adjustment; accordingly, it is possible to reduce the power consumption of the output circuit in the idling mode.

The amount of current which flows through the drive circuit 420 in the idling mode is adjusted taking the channel length modulation effect of the MOS current source into consideration; accordingly, it is not necessary to lengthen the gate length of the MOS current source in order to suppress the channel length modulation effect. As a result, it is possible to make smaller the area of the output circuit.

A Modified Example of Embodiment 4

Figure 30:
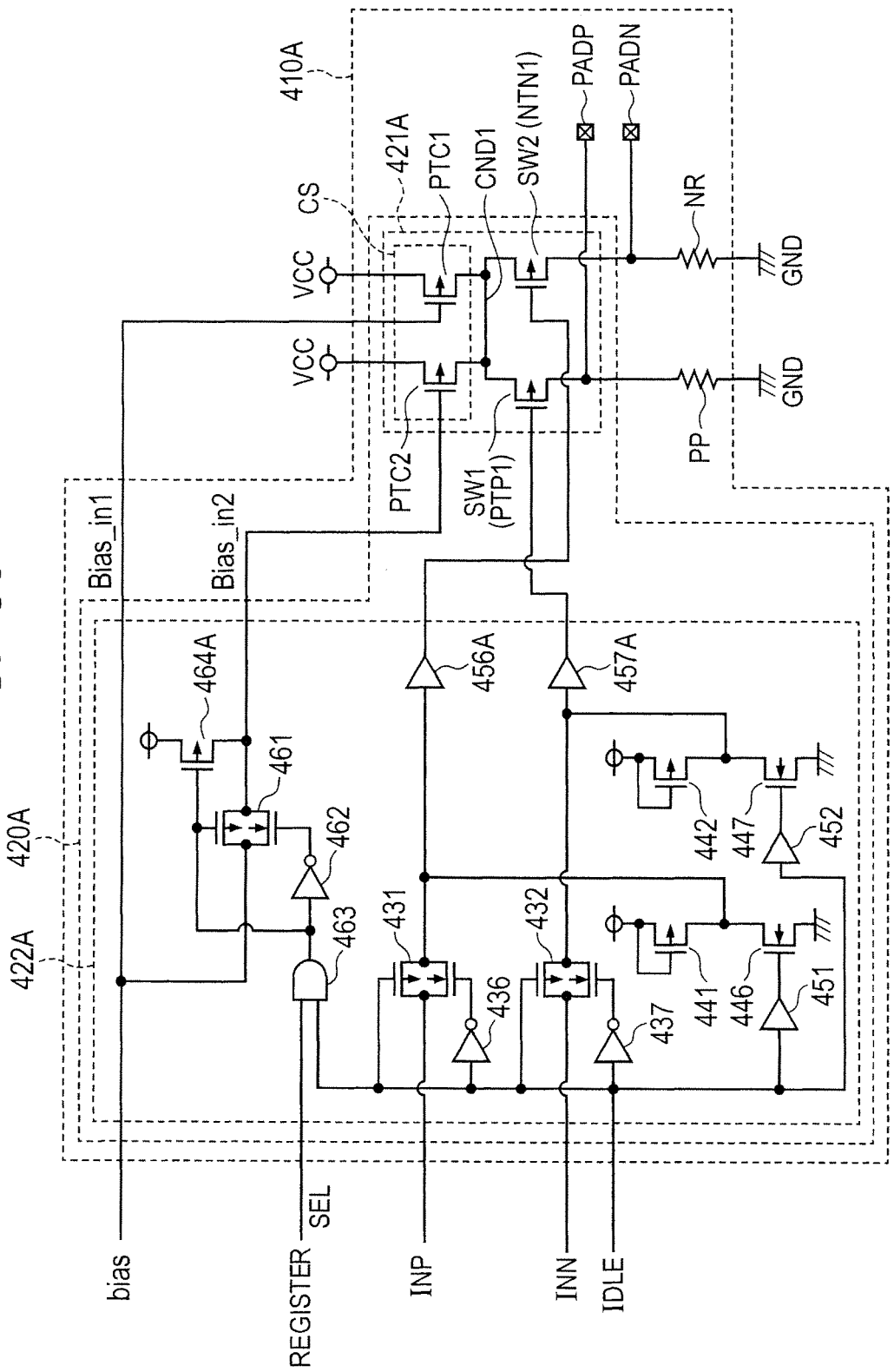
FIG. 30 is a block diagram illustrating a configuration of an output circuit 410A according to a modified example of Embodiment 4.

FIG. 30 is a block diagram illustrating a configuration of an output circuit 410A according to a modified example of Embodiment 4. The modified example of Embodiment 4 differs from Embodiment 4 in the points that the transistor which composes each driver is changed from an NMOS transistor to a PMOS transistor, and that the termination resistors RP and RN are provided between the output terminals PADP and PADN and the ground node GND, respectively. Hereinafter, the different points from Embodiment 4 are mainly explained.

As illustrated in FIG. 30, the output circuit 410A includes output terminals PADP and PADN, a termination resistor RP on the positive phase side, a termination resistor RN on the negative phase side, and a drive circuit 420A.

The termination resistor RP on the positive phase side is coupled between the ground node GND and the output terminal PADP on the positive phase side. The termination resistor RN on the negative phase side is coupled between the ground node GND and the output terminal PADN on the negative phase side.

The drive circuit 420A flows a constant current through one of the termination resistors RP and RN between the power node VCC and the ground node GND in the normal mode, corresponding to the inputted differential serial signals INP and INN. In the idling mode, the drive circuit 420A flows a constant current through both termination resistors RP and RN.

In further detail, the drive circuit 420A includes a driver 421A and a pre-driver and control circuit 422A. The driver 421A includes a PMOS transistor PTP1 as a switch SW1, a PMOS transistor PTN1 as a switch SW2, and a constant current source CS. The transistor PTP1 is coupled between the output terminal PADP and a connection node CND1. The transistor PTN1 is coupled between the output terminal PADN and the connection node CND1. A control signal is inputted to gates of the transistors PTP1 and PTN1 from the pre-driver and control circuit 422.

The constant current source CS includes PMOS transistors PTC1 and PTC2 coupled in parallel with each other between the connection node CND1 and the power node VCC. Control voltages Bias_in1 and Bias_in2 are inputted to gates of the transistor PTC1 and PTC2 from the pre-driver and control circuit 422, respectively.

The configuration and operation of the pre-driver and control circuit 422A are the same as those in Embodiment 4. However, the pre-driver and control circuit 422A illustrated in FIG. 30 differs from the pre-driver and control circuit 422 illustrated in FIG. 28 in that buffers 456A and 457A are included in lieu of the inverters 456 and 457. An output of the buffer 456A is fed to a gate of the transistor PTN1 as the switch SW2. An output of the buffer 457A is fed to a gate of the transistor PTP1 as the switch SW1. Furthermore, the pre-driver and control circuit 422A illustrated in FIG. 30 differs from the pre-driver and control circuit 422 illustrated in FIG. 28 in that a PMOS transistor 464A is included in lieu of the NMOS transistor 464. The transistor 464A is coupled between the output node of the transmission gate 461 and the power node VCC. FIG. 30 is the same as FIG. 28 in the other points; accordingly, the same reference symbol will be attached to the same or corresponding part, and the explanation thereof will not be repeated.

The output circuit 410A having the configuration described above also brings about the same effect as is the case with the output circuit 410 illustrated in Embodiment 4.

Another Modified Example of Embodiment 4

The constant current sources CS illustrated in FIG. 28 and FIG. 30 are configured with two transistors coupled in parallel, for the sake of simplicity. However, it is desirable to enable fine adjustment of the amount of current in the idling mode, by coupling a larger number of transistors in parallel.

Specifically, the driver 421 (or 421A) includes plural constant current source transistors coupled in parallel with each other between the ground node GND (or the power node VCC) and the connection node CND1. One or more specific constant current source transistors as a part of the plural constant current source transistors can be switched to one of an operating state and a non-operating state, and are set to the operating state in the normal mode and to the non-operating state in the idling mode. One or more remaining constant current source transistors except the one or more specific constant current source transistors are in the operating state, both in the normal mode and in the idling mode.

As described above, the invention accomplished by the present inventors has been concretely explained based on the embodiments. However, it cannot be overemphasized that the present invention is not restricted to the embodiments, and it can be changed variously in the range which does not deviate from the gist.

What is claimed is:
1. A semiconductor device comprising:
a first power node;
a second power node, a power supply voltage being applied between the first power node and the second power node; and
an output circuit which has a normal mode and an idling mode,
wherein the output circuit comprises:
a first output node;
a second output node;
a first termination resistor coupled between the first power node and the first output node;
a second termination resistor coupled between the first power node and the second output node; and
a drive circuit operable to flow a constant current between the first power node and the second power node via at least one of the first termination resistor and the second termination resistor,
wherein, in the normal mode, when the drive circuit flows the constant current through one of the first termination resistor and the second termination resistor in response to a differential input signal, the output circuit outputs a differential signal corresponding to an input signal from the first output node and the second output node,
wherein, in the idling mode, when the drive circuit flows the constant current through both of the first termination resistor and the second termination resistor, the output circuit outputs an idling voltage from the first output node and the second output node, and wherein the output circuit adjusts one of the value of the current flowing through the first termination resistor and the second termination resistor and the value of resistance of the first termination resistor and the second termination resistor, so as to make substantially equal the idling voltage outputted in the idling mode and a common voltage of the differential signal outputted in the normal mode.

2. The semiconductor device according to claim 1, wherein the drive circuit comprises a plurality of drivers coupled in parallel with each other, wherein, in the normal mode, each of the plural drivers flows a constant current through one of the first termination resistor and the second termination resistor, corresponding to the input signal, and wherein, in the idling mode, each of one or more specific drivers as a part of the plural drivers does not flow current through either the first termination resistor or the second termination resistor, and each of one or more remaining drivers except for the one or more specific drivers flows a constant current through both of the first termination resistor and the second termination resistor.

3. The semiconductor device according to claim 2, wherein each of the plural drivers comprises:

a constant current source with one end coupled to the second power node;

a first switch coupled between the other end of the constant current source and the first output node; and a second switch coupled between the other end of the constant current source and the second output node, wherein, in the normal mode, one of the first switch and the second switch included in each of the plural drivers is in a conductive state and the other is in a non-conductive state, corresponding to the input signal, and wherein, in the idling mode, both of the first switch and the second switch included in each of the one or more specific drivers are in a non-conductive state, and both of the first switch and the second switch included in each of the one or more remaining drivers are in a conductive state.

4. The semiconductor device according to claim 2, wherein each of the plural drivers comprises:

a constant current source with one end coupled to the second power node;

a first switch coupled between the other end of the constant current source and the first output node; and a second switch coupled between the other end of the constant current source and the second output node, wherein, in the normal mode, one of the first switch and the second switch included in the plural drivers is in a conductive state and the other is in a non-conductive state, corresponding to the input signal, wherein, in the idling mode, both of the first switch and the second switch included in each of the one or more remaining drivers are in a conductive state, wherein the constant current source included in each of the one or more specific drivers can be switched to one of an operating state and a non-operating state, and is in the operating state in the normal mode and in the non-operating state in the idling mode, and wherein the one or more remaining constant current sources except for the one or more specific constant current sources are in the operating state both in the normal mode and in the idling mode.

5. The semiconductor device according to claim 1, wherein the drive circuit comprises:

a plurality of constant current sources each of which has one end coupled to the second power node and the other end coupled to a common connection node;

a first switch coupled between the common connection node and the first output node; and a second switch coupled between the common connection node and the second output node, wherein, in the normal mode, one of the first switch and the second switch is in a conductive state and the other is in a non-conductive state, corresponding to the input signal, wherein, in the idling mode, both of the first switch and the second switch are in the conductive state, wherein one or more specific constant current sources as a part of the plural constant current sources can be switched to one of an operating state and a non-operating state, and are in the operating state in the normal mode and in the non-operating state in the idling mode, and wherein the one or more remaining constant current sources except for the one or more specific constant current sources are in the operating state, both in the normal mode and in the idling mode.

6. The semiconductor device according to claim 1, wherein the value of resistance of each of the first termination resistor and the second termination resistor is variable, and wherein the value of resistance of each of the first termination resistor and the second termination resistor in the idling mode is smaller than the value of resistance of each of the first termination resistor and the second termination resistor in the normal mode.

7. A semiconductor device comprising:

a first power node;

a second power node, a power supply voltage being applied between the first power node and the second power node; and an output circuit which has a normal mode and an idling mode, wherein the output circuit comprises:

a first output node;

a second output node;

a first termination resistor coupled between the first power node and the first output node;

a second termination resistor coupled between the first power node and the second output node; and a plurality of drivers coupled in parallel and operable to flow a constant current between the first power node and the second power node via at least one of the first termination resistor and the second termination resistor, wherein each of the plural drivers comprises:

a constant current source with one end coupled to the second power node;

a first switch coupled between the other end of the constant current source and the first output node; and a second switch coupled between the other end of the constant current source and the second output node, wherein, in the normal mode, when one of the first switch and the second switch included in each of the plural drivers is in a conductive state and the other is in a non-conductive state, corresponding to a common differential input signal, the output circuit outputs a differential signal corresponding to an input signal from the first output node and the second output node, and wherein, in the idling mode, when both of the first switch and the second switch included in each of one or more specific drivers as apart of the plural drivers are in a non-conductive state, and when the first switch and the second switch included in each of the one or more remaining drivers except for the one or more specific drivers are in a conductive state, the output circuit outputs an idling voltage from the first output node and the second output node.

8. The semiconductor device according to claim 7, further comprising:
a register operable to hold information on whether both of the first switch and the second switch are set in a non-conductive state in the idling mode, in regard to each of at least a part of drivers included in the output circuit,
wherein, in the idling mode, each of the one or more specific drivers is set in a non-conductive state, on the basis of the information held in the register.

9. The semiconductor device according to claim 7,
wherein, in regard to each of the plural drivers, whether both of the first switch and the second switch are in a non-conductive state in the idling mode is determined in advance so as to make substantially equal the idling voltage outputted in the idling mode and a common voltage of the differential signal outputted in the normal mode.

* * * * *